United States Patent
Iyama et al.

(10) Patent No.: US 9,165,948 B2
(45) Date of Patent: Oct. 20, 2015

(54) THIN FILM TRANSISTOR ARRAY SUBSTRATE AND LIQUID CRYSTAL DISPLAY DEVICE

(71) Applicant: Sharp Kabushiki Kaisha, Osaka-shi, Osaka (JP)

(72) Inventors: Yuichi Iyama, Osaka (JP); Takatomo Yoshioka, Osaka (JP); Kazuhiko Tsuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 30 days.

(21) Appl. No.: 14/351,998

(22) PCT Filed: Oct. 24, 2012

(86) PCT No.: PCT/JP2012/077394
§ 371 (c)(1),
(2) Date: Apr. 15, 2014

(87) PCT Pub. No.: WO2013/065529
PCT Pub. Date: May 10, 2013

(65) Prior Publication Data
US 2014/0264330 A1    Sep. 18, 2014

(30) Foreign Application Priority Data

Oct. 31, 2011 (JP) ................................. 2011-239348

(51) Int. Cl.
*H01L 27/32*    (2006.01)
*H01L 27/12*    (2006.01)
(Continued)

(52) U.S. Cl.
CPC ...... *H01L 27/1225* (2013.01); *G02F 1/134309* (2013.01); *G02F 1/136286* (2013.01); *G02F 2001/134372* (2013.01)

(58) Field of Classification Search
CPC .................. H01L 27/1225; H01L 27/3276
USPC ........................................................ 257/72
See application file for complete search history.

(56) References Cited

U.S. PATENT DOCUMENTS 5,335,102 A * 8/1994 Kanemori et al. ............... 349/55
5,642,211 A * 6/1997 Okano et al. ..................... 349/41
(Continued)

FOREIGN PATENT DOCUMENTS

JP    2002-296608 A    10/2002
JP    2002-365657 A    12/2002
(Continued)

OTHER PUBLICATIONS

Official Communication issued in International Patent Application No. PCT/JP2012/077394, mailed on Nov. 27, 2012.
(Continued)

*Primary Examiner* — Michael Lebentritt
(74) *Attorney, Agent, or Firm* — Keating & Bennett, LLP

(57) ABSTRACT

The present invention provides a thin film transistor array substrate and a liquid crystal display device including the thin film transistor array substrate that are preferably applicable to a liquid crystal display device including the three-layered electrode structure that enables high response speed and high transmittance, and can have a high aperture ratio. The thin film transistor array substrate of the present invention includes: a thin film transistor element, gate bus lines, and source bus lines, in which the thin film transistor array substrate includes electrodes, the electrodes include a first electrode and a second electrode, the first electrode includes a linear portion along the source bus lines, the first electrode includes a linear portion along the gate bus lines, at least one linear portion along the source bus lines is disposed transversely to the linear portion along the gate bus lines in a plan view of main face of the substrate and is connected to a drain electrode of the thin film transistor element at a position overlapping the gate bus lines, and the second electrode is a planar electrode.

10 Claims, 13 Drawing Sheets

(51) Int. Cl.
*G02F 1/1343* (2006.01)
*G02F 1/1362* (2006.01)

(56) References Cited

U.S. PATENT DOCUMENTS

| | | | |
|---|---|---|---|
| 5,774,099 A * | 6/1998 | Iwasaki et al. | 345/87 |
| 6,040,889 A * | 3/2000 | Takatori et al. | 349/174 |
| 6,563,481 B1 * | 5/2003 | Watanabe et al. | 345/87 |
| 8,242,698 B2 * | 8/2012 | Tokuda et al. | 315/160 |
| 2001/0003446 A1 * | 6/2001 | Takafuji | 345/98 |
| 2002/0140649 A1 | 10/2002 | Aoyama et al. | |
| 2003/0128306 A1 * | 7/2003 | Kai | 349/39 |
| 2005/0024548 A1 | 2/2005 | Choi et al. | |
| 2005/0140620 A1 | 6/2005 | Aoyama et al. | |
| 2005/0168665 A1 * | 8/2005 | Ina et al. | 349/42 |
| 2005/0253797 A1 * | 11/2005 | Kamada et al. | 345/89 |
| 2006/0017674 A1 * | 1/2006 | Kamada | 345/87 |
| 2007/0008444 A1 * | 1/2007 | Nakanishi et al. | 349/43 |
| 2009/0091700 A1 | 4/2009 | Ono | |
| 2010/0053484 A1 | 3/2010 | Ono | |
| 2010/0238151 A1 * | 9/2010 | Kitayama et al. | 345/209 |
| 2012/0007843 A1 * | 1/2012 | Hoshino | 345/204 |
| 2012/0069282 A1 * | 3/2012 | Okazaki et al. | 349/139 |
| 2012/0162562 A1 | 6/2012 | Ono | |
| 2013/0314397 A1 * | 11/2013 | Tanaka | 345/215 |
| 2014/0016075 A1 | 1/2014 | Iwata et al. | |
| 2014/0036192 A1 | 2/2014 | Iyama et al. | |

FOREIGN PATENT DOCUMENTS

| | | |
|---|---|---|
| JP | 2006-523850 A | 10/2006 |
| JP | 2009-092912 A | 4/2009 |
| JP | 2010-060857 A | 3/2010 |
| JP | 2011-029373 A | 2/2011 |

OTHER PUBLICATIONS

Yoshioka et al.; "Liquid Crystal Display Panel, and Liquid Crystal Display Device"; U.S. Appl. No. 14/126,455, filed Dec. 16, 2013.
Iyama et al.; "Liquid Crystal Drive Device and Liquid Crystal Display Device"; U.S. Appl. No. 14/126,458, filed Dec. 16, 2013.
Imaoku et al.; "Liquid Crystal Display Panel and Liquid Crystal Display Device"; U.S. Appl. No. 14/126,461, filed Dec. 16, 2013.
Aoyama et al.; "Liquid Crystal Display Panel and Liquid Crystal Display Device"; U.S. Appl. No. 14/126,459, filed Dec. 16, 2013.
Iyama et al.; "Liquid Crystal Driving Method and Liquid Crystal Display Device"; U.S. Appl. No. 14/350,962, filed Apr. 10, 2014.
Yoshioka et al.; "Liquid Crystal Display Panel and Liquid Crystal Display Device"; U.S. Appl. No. 14/351,989, filed Apr. 15, 2014.

* cited by examiner

THIN FILM TRANSISTOR ARRAY SUBSTRATE AND LIQUID CRYSTAL DISPLAY DEVICE

TECHNICAL FIELD

The present invention relates to a thin film transistor array substrate and a liquid crystal display device. The present invention specifically relates to a thin film transistor array substrate used for a liquid crystal display device including liquid crystal molecules which are aligned in a vertical direction to main face of substrate when no voltage is applied, and a liquid crystal display device.

BACKGROUND ART

A thin film transistor array substrate can drive display/non-display by electrically controlling a display device and the like and becomes widely used, for example, as a substrate interposing a liquid crystal in a liquid crystal display device. Specifically, the thin film transistor array substrate is indispensable in everyday life and business as a display for devices including personal computers, televisions, onboard devices such as automotive navigation systems, personal digital assistants such as mobile phones, and display devices capable of displaying a stereoscopic image. In these applications, persons skilled in the art have studied the thin film transistor array substrate for liquid crystal display devices of various modes with different electrode arrangements for changing the optical characteristics of the liquid crystal layer.

Examples of the display modes of current liquid crystal display devices include: a vertical alignment (VA) mode in which liquid crystal molecules having negative anisotropy of dielectric constant are aligned vertically to the substrate surfaces; an in-plane switching (IPS) mode and a fringe field switching (FFS) mode in which liquid crystal molecules having positive or negative anisotropy of dielectric constant are aligned horizontally to the substrate surfaces and a transverse electric field is applied to the liquid crystal layer.

One document discloses, as a FFS-driving liquid crystal display device, a thin-film-transistor liquid crystal display having a high response speed and a wide viewing angle. The device includes a first substrate having a first common electrode layer, a second substrate having a pixel electrode layer and a second common electrode layer, a liquid crystal disposed between the first substrate and the second substrate, and a means for generating an electric field between the first common electrode layer of the first substrate and both of the pixel electrode layer and the second common electrode layer of the second substrate so as to provide a high response speed to a high input-data-transfer rate and a wide viewing angle for a viewer (for example, see Patent Literature 1).

Another document discloses, as a liquid crystal device with multiple electrodes applying a transverse electric field, a liquid crystal device including a pair of substrates opposite to each other, a liquid crystal layer which includes a liquid crystal having positive anisotropy of dielectric constant and which is disposed between the substrates, electrodes which are provided to the respective first and second substrates constituting the pair of substrates, facing each other with the liquid crystal layer therebetween, and which apply a vertical electric field to the liquid crystal layer, and multiple electrodes for applying a transverse electric field to the liquid crystal layer disposed in the second substrate (for example, see Patent Literature 2).

CITATION LIST

Patent Literature

Patent Literature 1: JP 2006-523850 T
Patent Literature 2: JP 2002-365657 A

SUMMARY OF INVENTION

Technical Problem

Patent Literature 1 discloses a FFS-driving liquid crystal display device, which enables high response speed by rotating liquid crystal molecules by electric fields in both rising and falling. The rising (where the display state changes from a dark state (black display) to a bright state (white display)) utilizes a fringe electric field (FFS driving) generated between an upper slit electrode and a lower planar electrode of a lower substrate. The falling (where the display state changes from a bright state (white display) to a dark state (black display)) utilizes a vertical electric field generated by the electric potential difference between the substrates.

Patent Literature 2 discloses a liquid crystal display device including a three-layered electrode structure, which improves a response speed by using comb driving. However, Patent Literature 2 only discloses a liquid crystal display device in which a display method is substantially a twisted nematic (TN) mode, and does not disclose a vertical-alignment liquid crystal display device that is advantageous to obtaining characteristics such as wide viewing angle and high contrast.

A liquid crystal display device including a vertical-alignment three-layered electrode structure (a counter electrode, an upper electrode, and a lower electrode) enables high response speed by rotating liquid crystal molecules by electric fields in both rising and falling; here, the rising utilizes a transverse electric field generated between upper comb-shaped electrodes in the lower substrate (or a fringe electric field by fringe driving between the upper electrode and the lower electrode), and the falling utilizes a vertical electric field generated by the electric potential difference between the upper and lower substrates. Particularly, as disclosed in Japanese Patent Application No. 2011-142346 and Japanese Patent Application No. 2011-142351, a transmittance during rising can further be improved by using, for example, a pair of comb-shaped electrodes as the upper electrodes that can generate a transverse electric field.

In this case, a drain electrode is electrically connected (linked) to an electrode (ITO) in order to drive. However, an aperture ratio may be decreased depending on a connecting method.

In addition, these electrodes may not be connected well due to shapes of the electrodes and positional relation with a TFT, when the upper electrodes include two or more electrodes that should perform TFT driving.

In the liquid crystal display device including the vertical-alignment three-layered electrode structure as mentioned above, the inventions disclosed in the aforementioned Patent Literatures as prior art documents should be elaborated on an electrode structure of an appropriate thin film transistor array substrate and a relationship between the electrode structure and transmittance.

The aforementioned Patent Literatures as prior art documents and Japanese Patent Application No. 2011-142346 and Japanese Patent Application No. 2011-142351 do not particularly disclose a driving method and do not disclose a problem and means for solving the problem at all, although the problem is caused when ITO and the drain electrode are electrically connected.

The present invention is devised in view of the above situation, and aims to provide a thin film transistor array substrate preferably used for a three-layered electrode structure liquid crystal display device enabling high response speed and high transmittance and having a large aperture ratio, and to provide a liquid crystal display device including the thin film transistor array substrate.

Solution to Problem

The present inventors have investigated that a vertical-alignment liquid crystal display panel and a liquid crystal display device satisfy both high response speed and high transmittance, and have focused on a thin film transistor array substrate used for a liquid crystal display device that controls alignment of liquid crystal molecules by electric fields in both rising and falling. Thus, the present inventors have further investigated an electrode structure, particularly optimum arrangement of electrodes of pixels when the electrode (ITO) and the drain electrode (pixel electrode) are connected, and have found that the vertical-alignment liquid crystal display panel and the liquid crystal display device can be driven without reducing the aperture ratio by elaborating a structure of electrodes and a positional relationship between a TFT and source bus lines. This elaboration is, for example, that electrodes of the thin film transistor array substrate include a first electrode (a pair of comb-shaped electrodes) and a second electrode (planar electrode); one of the pair of comb-shaped electrodes includes a linear portion along the source bus lines; the other of the pair of comb-shaped electrodes includes a linear portion along gate bus lines; the linear portion along the source bus lines is disposed transversely to the linear portion along the gate bus lines in a plan view of a main face of the substrate and is connected to a drain electrode of a thin film transistor element at a position overlapping the gate bus line.

The present inventors also have found that such a thin film transistor array substrate is particularly preferable for a liquid crystal display device in which a thin film transistor array substrate and a counter substrate which interpose a liquid crystal layer therebetween include electrodes, a transverse electric field is generated between upper comb-shaped electrodes (or a fringe electric field by fringe drive between the upper electrode and the lower electrode) in rising and a vertical electric field is generated by the electric potential difference between the substrates in falling, and this enables high response speed by rotating liquid crystal molecules by the electric fields in both the rising and the falling. As a result, the present inventors have arrived at the solutions of the above disadvantages and these findings have now led to completion of the present invention. As mentioned above, the present invention enables high response speed and high transmittance in the liquid crystal display device including the vertical-alignment three-layered electrode structure by elaborating arrangement of electrodes of pixels of the thin film transistor array substrate. Thus, the present invention is different from other inventions disclosed in prior art documents in this respect. The present invention can further solve a markedly poor response speed in a field-sequential driving liquid crystal display device and a low-temperature environment, and can have an excellent transmittance.

The present invention is a thin film transistor array substrate, including: a thin film transistor element, gate bus lines, and source bus lines, wherein the thin film transistor array substrate includes electrodes, the electrodes include a first electrode and a second electrode, the first electrode includes a linear portion along the source bus lines, the first electrode includes a linear portion along the gate bus lines, at least one linear portion along the source bus lines is disposed transversely to the linear portion along the gate bus lines in a plan view of a main face of the substrate and is connected to a drain electrode of the thin film transistor element at a position overlapping the gate bus lines, and the second electrode is a planar electrode.

The phrase "a linear portion along the source bus lines is disposed transversely to the linear portion along the gate bus lines in a plan view of a main face of the substrate" means that, for example, the linear portion along the source bus lines in the first electrode (preferably, one of the pair of comb-shaped electrodes mentioned later) passes on an extended line of the linear portion along the gate bus lines in the first electrode (preferably, the other of the pair of comb-shaped electrodes) in a plan view of the main face of the substrate. Here, the linear portion along the source bus lines is disposed so as to extend from one side delimited by the linear portion along the gate bus lines and its extended line to the other side. This allows the linear portion along the source bus lines to be connected to the drain electrode of the thin film transistor element at a position appropriately overlapping the gate bus lines, and the aperture ratio of the aforementioned connection portion (contact part) to be retained. The linear portion along the gate bus lines may not be transversely disposed in a vertical direction to the linear portion of the gate bus lines as long as the effect of the present invention is exerted. However, the linear portion is preferably transversely disposed in a substantially vertical direction.

Preferably, the first electrode is a pair of comb-shaped electrodes, one of the pair of comb-shaped electrodes includes a linear portion along the source bus lines, the other of the pair of comb-shaped electrodes includes a linear portion along the gate bus lines, and at least one linear portion along the source bus lines is disposed transversely to the linear portion along the gate bus lines in a plan view of the main face of the substrate and is connected to a drain electrode of the thin film transistor element at a position overlapping the gate bus lines.

The linear portion along the source bus lines is preferably longer than the linear portion along the gate bus lines in a plan view of the main face of the substrate. For example, the length of the linear portion along the source bus lines can be set to 1.05 to 1.3 times longer than the length of the linear portion along the gate bus lines in a plan view of the main face of the substrate. This allows the linear portion along the source bus lines to be connected to the drain electrode of the thin film transistor element at the position more adequately overlapping the gate bus lines, for example, when the length of the pitch in a vertical direction and the length of the pitch in a transverse direction in the pixels are substantially equal.

The source bus lines preferably include at least two source bus lines that simultaneously drive at least two pixels along the source bus lines. More preferably, the two pixels are adjacent each other along the source bus lines. For example, the double source driving as mentioned above enables, in particular, a large liquid crystal display panel to have a sufficiently long signal writing time to the pixels and enables the pixels to be sufficiently charged. One of the particularly preferable embodiments of the present invention is that the source bus lines include two source bus lines that can simultaneously drive two adjacent pixels along the source bus lines. Not all source lines in the thin film transistor array substrate may be used to simultaneously drive at least two adjacent pixels as long as the effects are exerted.

Preferably, the first electrode is disposed in each pixel, the linear portion along the gate bus lines passes through the center of the pixel, and the first electrodes that are disposed in two pixels adjacent each other along the source bus lines include a structure which is mutually inverted in a plan view of the main face of the substrate. The term "structure which is inverted" herein means an electrode structure that is almost same as an electrode structure when the pixel is rotated at 180°. The thin film transistor array substrate capable of the double source driving can connect the linear portion along the source bus lines to the drain electrode of the thin film transistor element at the position overlapping the gate bus lines by providing the structure in which the first electrodes are sequentially inverted along the source bus lines as mentioned above when the linear portion along the gate bus lines passes through the center of the pixel.

Preferably, the thin film transistor array substrate includes at least four source bus lines overlapped with one pixel, and each of two source bus lines disposed inward by one line from outside portions of the pixel is electrically connected to the one of the pair of comb-shaped electrodes or electrically connected to the other of the pair of comb-shaped electrodes. The phrase "includes at least four source bus lines overlapped with one pixel" herein usually satisfies the state in which mutually substantially parallel four source bus lines are disposed so as to be overlapped with one pixel in a plan view of the main face of the substrate. The number of the source bus lines is at least four because the lower electrode can be driven by connecting the lower electrode along the source bus lines or the gate bus lines even when TFTs of each pixel do not exist. Usually, the number of the source bus lines overlapped with one pixel is six when the lower electrode is driven by TFTs of each pixel.

Preferably, the thin film transistor array substrate includes at least four source bus lines overlapped with one pixel, and two source bus lines disposed inward by one line from outside portions of the pixel are connected to outside linear portions of the pair of comb-shaped electrodes. The two source bus lines disposed inward by one line from outside portions of the pixel are particularly preferably connected to the outmost linear portions of the pair of comb-shaped electrodes. The term "outside" herein satisfies, for example, the position which is near the outside portion of the pixel in a longitudinal direction of the gate bus lines.

Thus connected source bus lines disposed inward by one line allow all TFTs and pixel electrodes to preferably be connected.

The planar electrode is preferably commonly connected between pixels in a direction of the source bus lines or pixels in a direction of the gate bus lines. This can reduce one TFT per pixel, for example, and, as a result, can increase the aperture ratio.

The thin film transistor element preferably includes an oxide semiconductor.

The first electrode is preferably an electrode for generating a transverse electric field. The transverse electric field means an electric field in a horizontal direction to the main face of the substrate. The liquid crystal display panel of the present invention is usually a liquid crystal display panel to perform white display by generating this electric field in a horizontal direction. In other words, the transverse electric field may be an electric field including a horizontal component such as a fringe electric field generated between the upper electrode and the lower electrode of the substrates. However, the transverse electric field is preferably a transverse electric field generated between a pair of comb-shaped electrodes (preferably a pair of comb-shaped electrodes disposed in the same layer).

Specifically, the first electrode is preferable a pair of comb-shaped electrodes. The pair of comb-shaped electrodes may satisfy that two comb-shaped electrodes are disposed opposite to each other in a plan view of the main face of the substrate. This pair of comb-shaped electrodes suitably generates a transverse electric field therebetween. With a liquid crystal layer including liquid crystal molecules having positive anisotropy of dielectric constant, the response performance and the transmittance are excellent in rising. With a liquid crystal layer including liquid crystal molecules having negative anisotropy of dielectric constant, the liquid crystal molecules are rotated by a transverse electric field to provide a high response speed in falling. The electrodes that the first substrate and the second substrate include may provide the potential difference between the substrates. This generates a vertical electric field by the electric potential difference between the substrates in falling with a liquid crystal layer including liquid crystal molecules having positive anisotropy of dielectric constant and in rising with a liquid crystal layer including liquid crystal molecules having negative anisotropy of dielectric constant, and rotates the liquid crystal molecules by the electric field to provide a high response speed.

The pair of comb-shaped electrodes may be disposed in the same layer or may be disposed in different layers as long as it provides the effects of the present invention. The pair of comb-shaped electrodes are preferably disposed in the same layer. The phrase "the pair of comb-shaped electrodes are disposed in the same layer" herein means that the comb-shaped electrodes are in contact with the same component (e.g. insulating layer, liquid crystal layer) on the liquid crystal layer side and/or the side opposite to the liquid crystal layer side, respectively.

The pair of comb-shaped electrodes preferably satisfy that the teeth portions are along each other in a plan view of the main face of the substrate. Particularly preferably, the teeth portions of the pair of comb-shaped electrodes are substantially parallel with each other, in other words, each of the pair of comb-shaped electrodes includes multiple substantially parallel slits.

The pair of comb-shaped electrodes preferably have different electric potentials at a threshold voltage or higher. This means a voltage value that provides a transmittance of 5% with the transmittance in the bright state defined as 100%, for example. The phrase "have different electric potentials at a threshold voltage or higher" herein at least means that a driving operation that generates different electric potentials at a threshold voltage or higher can be implemented. This makes it possible to suitably control the electric field applied to the liquid crystal layer. The upper limit of each of the different electric potentials is preferably 20 V, for example. Examples of a structure for providing different electric potentials include a structure in which one comb-shaped electrode of the pair of comb-shaped electrodes is driven by a certain TFT while the other comb-shaped electrode is driven by another TFT or the other comb-shaped electrode communicates with the electrode disposed below the other comb-shaped electrode. This structure makes it possible to provide different electric potentials of the pair of comb-shaped electrodes. The width of each tooth portion of the pair of comb-shaped electrodes is preferably 2 µm or greater, for example. The gap (also referred to as the space herein) between teeth portions is preferably 2 µm to 7 µm, for example.

The phrase "planar electrode" included in the thin film transistor array substrate of the present invention herein includes a mode in which multiple electrode portions of multiple pixels are electrically connected. Preferable examples of such a mode of the planar electrode of the thin film transistor array substrate include a mode in which electrode portions of all the pixels are electrically connected and a mode in which electrode portions are electrically connected along a pixel line.

A particularly preferable mode is such that the electrodes (upper electrodes) at the liquid crystal layer side of the thin film transistor array substrate constitute a pair of comb-shaped electrodes (or a slit electrode) and the electrode (lower electrode) opposite to the liquid crystal layer side of the thin film transistor array substrate constitutes a planar electrode. This allows the transverse electric field and the vertical electric field to be preferably applied when the thin film transistor array substrate of the present invention is applied to a liquid crystal display device. For example, the planar electrode can be disposed through an insulating layer below the pair of comb-shaped electrodes (or the slit electrode) of the thin film transistor array substrate. The planar electrode of the thin film transistor array substrate is preferably constituted by electrode portions electrically connected along a pixel line, and may be separate in each pixel unit. In the case where one of the pair of the comb-shaped electrodes is communicated with the planar electrode that is a lower electrode of the comb-shaped electrodes and the planar electrode is electrically connected along the pixel line, the comb-shaped electrodes are also electrically connected along the pixel line. This mode is also one preferable mode of the present invention. The planar electrode of the thin film transistor array substrate of the present invention is preferably planar at least at the portion overlapping the electrode of the thin film transistor array substrate in a plan view of the main face of the substrate. The phrase "electrically connected along the pixel line" herein at least satisfies the state regarded as being electrically connected to multiple pixels along at least any one of vertical and transverse pixel arrays. Each electrode in all pixel lines is not necessary to be electrically connected. In the liquid crystal display panel, each electrode may be substantially electrically connected along the pixel line.

The planar electrode is preferably formed such that it interposes an electrically resistant layer with the pair of comb-shaped electrodes. The electrically resistant layer is preferably an insulating layer. The "insulating layer" herein is at least regarded as an insulating layer in the technical field of the present invention.

A mode in which the planar electrode is electrically connected in the same pixel line is more preferred. In the case where the thin film transistor array substrate is an active matrix substrate, the term "the same pixel line" herein means a pixel line aligned along the gate bus lines in the active matrix substrate in a plan view of the main face of the substrate. As mentioned above, electric connection of a planar electrode of the first substrate and/or a planar electrode of the second substrate in the same pixel line enables application of a voltage to the electrodes so that the electric potential change of pixels in each even-numbered gate bus line and that in each odd-numbered gate bus line are inverted, thereby suitably generating a vertical electric field to provide a high response speed.

The planar electrode of the thin film transistor array substrate herein at least satisfies the state regarded as having a planar shape in the technical field of the present invention, and may include an alignment-controlling structure such as a rib or a slit in a certain region or may include such an alignment-controlling structure at the center portion of a pixel in a plan view of the main face of the substrate. Still, preferably, the planar electrode includes substantially no alignment-controlling structure.

Here, the commonly connected lower electrodes (the planar electrode of the thin film transistor array substrate) corresponding to even-numbered gate-bus lines and the commonly connected lower electrodes corresponding to odd-numbered gate-bus lines may be formed, and the electric potential changes thereof may be inverted in response to application of a voltage to these lower electrodes. The electric potential of an electrode maintained at a certain voltage may be defined as a middle electric potential. Assuming that this electric potential of an electrode maintained at a certain voltage is 0 V, the polarity of the voltage applied to the lower electrodes is considered to be inverted in each bus line.

The thin film transistor array substrate of the liquid crystal display panel of the present invention constitutes one of a pair of substrates interposing the liquid crystal layer. The thin film transistor array substrate may include an insulating substrate (e.g. glass, resin) as its base material, and the substrate is formed by disposing wirings, electrodes, color filters, and the like on the insulating substrate.

Preferably, at least one of the pair of comb-shaped electrodes is a pixel electrode and the thin film transistor array substrate of the present invention is an active matrix substrate.

The present invention also relates to a liquid crystal display device including the thin film transistor array substrate of the present invention. Preferable modes of the thin film transistor array substrate in the liquid crystal display device of the present invention are the same as the aforementioned preferable modes of the liquid crystal display panel of the present invention.

The liquid crystal display panel of the present invention usually includes the thin film transistor array substrate of the present invention, a counter substrate, and a liquid crystal layer interposed between both substrates.

The counter substrate preferably includes an electrode. The electrode is preferably a planar electrode. The planar electrode of the counter substrate at least satisfies the state regarded as having a planar shape in the technical field of the present invention, and may include an alignment-controlling structure such as a rib or a slit in a certain region or may include such an alignment-controlling structure at the center portion of a pixel in a plan view of the main face of the substrate. Still, preferably, the planar electrode includes substantially no alignment-controlling structure.

The liquid crystal layer is usually aligned by an electric field generated between an electrode of the thin film transistor array substrate of the present invention or between the thin film transistor array substrate of the present invention and the counter substrate so that it contains a component horizontal to the main faces of the substrates at a threshold voltage or higher. In particular, the liquid crystal layer preferably includes liquid crystal molecules aligned in the horizontal direction. The phrase "aligned in the horizontal direction" herein at least satisfies the state regarded as being aligned in the horizontal direction in the technical field of the present invention by, for example, an electric field generated between the pair of comb-shaped electrodes. This further improves the transmittance. The liquid crystal molecules in the liquid crystal layer are preferably substantially constituted by liquid crystal molecules aligned in the horizontal direction to the main faces of the substrates at a threshold voltage or higher.

The liquid crystal layer preferably includes liquid crystal molecules having positive anisotropy of dielectric constant (positive-type liquid crystal molecules). The liquid crystal molecules having positive anisotropy of dielectric constant are aligned in a certain direction when an electric field is applied. The alignment thereof is easily controlled and such molecules provide a higher response speed. The liquid crystal layer may also preferably include liquid crystal molecules having negative anisotropy of dielectric constant (negative-type liquid crystal molecules). This further improves the transmittance. In other words, from the viewpoint of a high response speed, the liquid crystal molecules are preferably substantially constituted by liquid crystal molecules having positive anisotropy of dielectric constant. From the viewpoint of transmittance, the liquid crystal molecules are preferably substantially constituted by liquid crystal molecules having negative anisotropy of dielectric constant.

In the liquid crystal display device of the present invention, at least one of the thin film transistor array substrate and the counter substrate usually includes an alignment film on the liquid crystal layer side. The alignment film is preferably a vertical alignment film. Examples of the alignment film include alignment films formed from organic material or inorganic material, and photo-alignment films formed from photoactive material. The alignment film may be an alignment film without any alignment treatment such as rubbing. Alignment films formed from organic or inorganic materials and photo-alignment films each requiring no alignment treatment enable simplification of the process to reduce the cost, as well as improvement in the reliability and the yield. If an alignment film is subjected to rubbing, the rubbing may cause disadvantages such as liquid crystal contamination due to impurities from rubbing cloth, dot defects due to contaminants, and display unevenness due to uneven rubbing in liquid crystal panel. On the contrary, alignment films formed from organic or inorganic material and photo-alignment films can eliminate these disadvantages. At least one of the thin film transistor array substrate and the counter substrate preferably includes a polarizing plate on the side opposite to the liquid crystal layer side. The polarizing plate is preferably a circularly polarizing plate. This makes it possible to further improve the transmittance. The polarizing plate may also preferably be a linearly polarizing plate. This constitution makes it possible to give excellent viewing angle characteristics.

The liquid crystal display device of the present invention usually generates the electric potential difference at least between an electrode of the thin film transistor array substrate and an electrode of the counter substrate in the presence of a vertical electric field. A preferable mode thereof is such that the higher electric potential difference is generated between the electrode of the thin film transistor array substrate and the electrode of the counter substrate than that between electrodes (e.g. the pair of comb-shaped electrodes) of the thin film transistor array substrate.

When a transverse electric field is generated, the electric potential difference is usually generated at least between electrodes (e.g. the pair of comb-shaped electrodes) of the thin film transistor array substrate. For example, the device may be in a mode such that the higher electric potential difference is generated between electrodes of the thin film transistor array substrate than that between the electrode of the thin film transistor array substrate and the electrode of the counter substrate. For image display at low gray scale values, the device may also be in a mode such that the lower electric potential difference is generated between the electrodes of the thin film transistor array substrate than that between the electrode of the thin film transistor array substrate and the electrode of the counter substrate.

The counter substrate of the liquid crystal display device of the present invention constitutes one of a pair of substrates interposing the liquid crystal layer. The counter substrate may include an insulating substrate (e.g. glass, resin) as its base material, and the substrate is formed by disposing wirings, electrodes, color filters, and the like on the insulating substrate.

The liquid crystal display device of the present invention may be of a transmission type, a reflection type, or a transflective type. Examples of the liquid crystal display device of the present invention include displays of personal computers, televisions, onboard devices such as automotive navigation systems, and personal digital assistants such as mobile phones. Particularly preferably, the liquid crystal display device is applied to devices used at low-temperature conditions, such as onboard devices including automotive navigation systems.

The planar electrodes are preferably electrically connected along the pixel line. The planar electrode may include a transparent conductor and a metal conductor electrically connected to the transparent conductor.

At least one of the pair of comb-shaped electrodes may be electrically connected to the planar electrode.

The phrase "electrodes are electrically connected along a pixel line" herein means that electrodes are electrically connected at least in the same pixel line. For example, electrodes may be connected in each pixel line, or electrodes may be connected in each group of n pixel lines (in each group of n lines). Either is preferred. Here, n is an integer of 2 or greater. The phrase "electrodes are connected in each group of multiple (n) pixel lines" herein at least means that electrodes corresponding to multiple pixel lines are electrically connected. Examples thereof include a mode in which electrodes are electrically connected in each odd-numbered pixel line or in each even-numbered pixel line. In the case where electrodes are connected in each group of multiple pixel lines, the electric potentials of the multiple lines are usually inverted at the same time.

The configuration of the thin film transistor array substrate and liquid crystal display device of the present invention is not especially limited by other components as long as it essentially includes such components, other configurations usually used for the thin film transistor array substrate and the liquid crystal display device may appropriate be applied.

The aforementioned modes may be employed in appropriate combination as long as the combination is not beyond the spirit of the present invention.

Advantageous Effects of Invention

The thin film transistor array substrate and the liquid crystal display device of the present invention are preferably applicable to a liquid crystal display device including the three-layered electrode structure that enables high response speed and high transmittance and can have a high aperture ratio.

DESCRIPTION OF EMBODIMENTS

Figure 1:
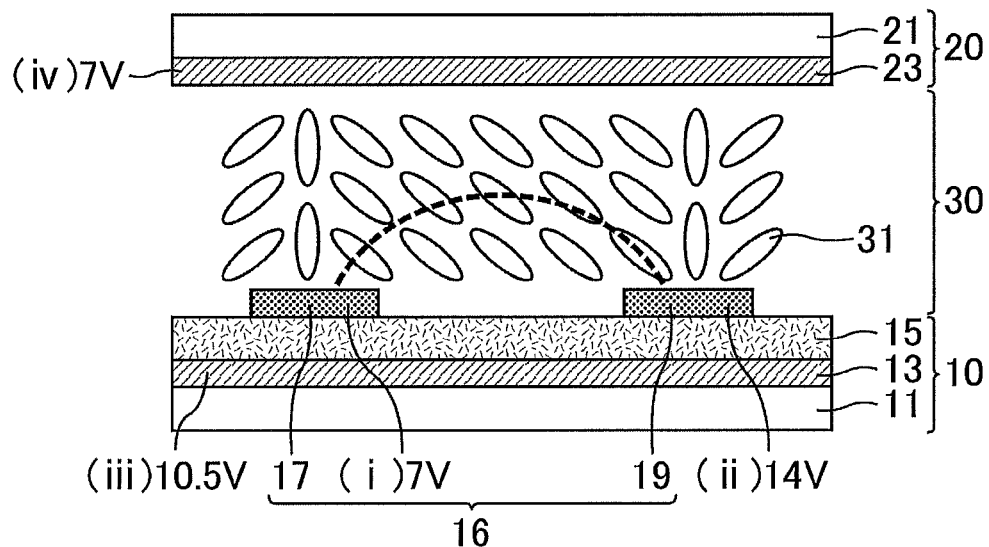
FIG. 1 is a schematic cross-sectional view showing a liquid crystal display device according to the present embodiment in the presence of a transverse electric field.

The present invention will be mentioned in more detail referring to the drawings in the following embodiments, but is not limited to these embodiments. The term "pixel" herein also means a subpixel unless otherwise specified. The planar electrode may include, for example, dot-patterned ribs and/or slits as long as the planar electrode satisfies the state regarded as being a planar electrode in the technical field of the present invention, and the planar electrode that does not substantially include an alignment-controlling structure is preferred. With respect to the electrodes disposed in the thin film transistor array substrate, the electrode on the display surface side is also referred to as an upper electrode, and the electrode on the side opposite to the display surface is also referred to as a lower electrode. The thin film transistor array substrate of the present embodiment is also referred to as a TFT substrate because it includes a thin film transistor element (TFT). In the liquid crystal display device of the present embodiment, the TFT is turned into the ON state and thereby a voltage is applied to at least one electrode (pixel electrode) of the pair of comb-shaped electrodes in both the rising (application of transverse electric field) and the falling (application of vertical electric field).

In each embodiment, the components or parts having the same function are given the same reference number. In the drawings, unless otherwise noted, the symbol (i) indicates an electric potential of one of the comb-shaped electrodes in the upper layer of the lower substrate, the symbol (ii) indicates an electric potential of the other of the comb-shaped electrodes in the upper layer of the lower substrate, the symbol (iii) indicates an electric potential of the planar electrode in the lower layer of the lower substrate, and the symbol (iv) indicates an electric potential of the planar electrode in the upper substrate. In each embodiment, the components or parts having the same function are given the same reference number. In the present embodiment, ITO (Indium Tin Oxide) is used as the upper electrode and the lower electrode. However, IZO (Indium Zinc Oxide) is also preferably used instead of ITO.

First, a liquid crystal display device that can preferably use a thin film transistor array substrate of the present embodiment will be described.

Figure 2:
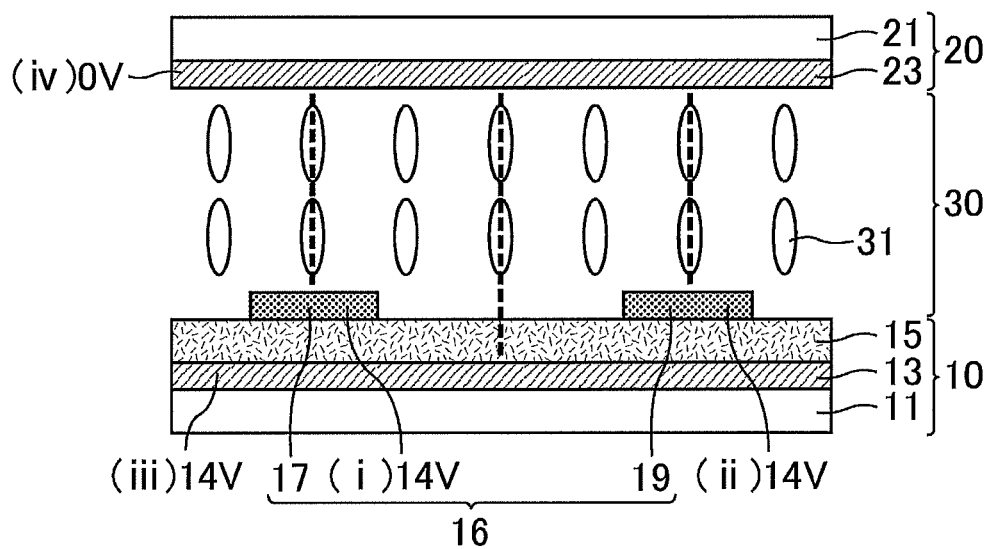
FIG. 2 is a schematic cross-sectional view showing a liquid crystal display device according to the present embodiment in the presence of a vertical electric field.

FIG. 1 is a schematic cross-sectional view showing a liquid crystal display device according to the present embodiment in the presence of a transverse electric field. FIG. 2 is a schematic cross-sectional view showing a liquid crystal display device according to the present embodiment in the presence of a vertical electric field. In FIG. 1 and FIG. 2, a dot line indicates a direction of an electric field generated. The liquid crystal display panel according to Embodiment 1 includes a vertical-alignment three-layered electrode structure (upper electrodes of the lower substrate, which serve as the second layer, are a pair of comb-shaped electrodes (also referred to as a first electrode herein)) using liquid crystal molecules 31 which are a liquid crystal (positive-type liquid crystal) having positive anisotropy of dielectric constant. In rising, as shown in FIG. 1, a transverse electric field generated by the electric potential difference of 7 V between a pair of comb-shaped electrodes 16 (for example, a comb-shaped electrode 17 at an electric potential of 7V and a comb-shaped electrode 19 at an electric potential of 14V) rotates the liquid crystal molecules. In this case, substantially no electric potential difference is generated between the substrates (between a lower electrode 13 (also referred to as a second electrode herein) at an electric potential of 10.5 V and a counter electrode 23 at an electric potential of 7 V).

In falling, as shown in FIG. 2, a vertical electric field generated by the electric potential difference of 14 V between the substrates (for example, between each of the lower electrode 13, the upper electrode 17, and the upper electrode 19 at an electric potential of 14 V and the counter electrode 23 at an electric potential of 0 V) rotates the liquid crystal molecules. In this case, substantially no electric potential difference is generated between the pair of comb-shaped electrodes 16 (for example, consisting of the upper electrode 17 at an electric potential of 14 V and the upper electrode 19 at an electric potential of 14 V).

In both the rising and the falling, an electric field rotates the liquid crystal molecules to provide a high response speed. In other words, the transverse electric field between the pair of comb-shaped electrodes leads to the ON state to give a high transmittance in the rising, whereas the vertical electric field between the substrates leads to the ON state to give a high response speed in the falling. Further, the transverse electric field by comb driving also provides a high transmittance. Embodiment 1 and the following embodiments use a positive-type liquid crystal as the liquid crystal. Still, a negative-type liquid crystal may also be used instead of a positive-type liquid crystal. In the case of using a negative-type liquid crystal, the electric potential difference between the pair of substrates aligns the liquid crystal molecules in the horizontal direction and the electric potential difference between the pair of comb-shaped electrodes also aligns the liquid crystal molecules in the horizontal direction. This provides an excellent transmittance, and the electric field rotates the liquid crystal molecules to provide a high response speed in both the rising and the falling. Thin film transistor array substrates in each embodiment mentioned later can be particularly preferably applied to such a liquid crystal display device and can also be applied to an FFS driving liquid crystal display device and liquid crystal display device of a TBA mode. Such a liquid crystal display device may need three TFTs because of separately applying voltages to the comb-shaped electrode 17, the comb-shaped electrode 19, and the lower electrode 13 that is the planar electrode.

As shown in FIG. 1 and FIG. 2, the liquid crystal display panel according to Embodiment 1 includes a thin film transistor array substrate 10, a liquid crystal layer 30, and a counter substrate 20 (color filter substrate) stacked in the order set forth from the back side to the viewing side of the liquid crystal display panel. As shown in FIG. 2, the liquid crystal display panel of the present embodiment vertically aligns the liquid crystal molecules at lower than the threshold voltage. As shown in FIG. 1, an electric field generated between the upper electrodes 17 and 19 (the pair of comb-shaped electrodes 16) disposed on a glass substrate 11 (glass substrate of the thin film transistor array substrate) tilts the liquid crystal molecules in the horizontal direction between the comb-shaped electrodes when the voltage difference between the comb-shaped electrodes is not lower than the threshold voltage, thereby controlling the amount of light transmitted. The planar lower electrode 13 (counter electrode 13) is disposed such that it interposes an insulating layer 15 with the upper electrodes 17 and 19 (the pair of comb-shaped electrodes 16). The insulating layer 15 may be formed from an oxide film (e.g. $SiO_2$), a nitride film (e.g. SiN), or an acrylic resin, for example, and these materials may be used in combination.

Although not shown in FIG. 1 and FIG. 2, a polarizing plate is disposed on each substrate at the side opposite to the liquid crystal layer. The polarizing plate may be a circularly polarizing plate or may be a linearly polarizing plate. An alignment film is disposed on the liquid crystal layer side of each substrate. The alignment films each may be an organic alignment film or may be an inorganic alignment film. In addition, these alignment films may be alignment films that align liquid crystal molecules in the vertical direction to the film surface or may be alignment films that align liquid crystal molecules in the horizontal direction to the film surface.

A voltage supplied from an image signal line is applied to the upper electrode 19, which drives the liquid crystal material, through a thin film transistor element (TFT) at the timing when a pixel is selected by a scanning signal line. The upper electrode 17 and the upper electrode 19 are formed in the same layer in each present embodiment mentioned later and are preferably in a mode where they are formed in the same layer. Still, they may be formed in different layers as long as the voltage difference is generated between the comb-shaped electrodes to apply a transverse electric field and provides one effect of the present invention, that is, the effect of improving the transmittance. The upper electrode 19 is connected to a drain electrode that extends from the TFT through a contact hole. In FIG. 1 and FIG. 2, the lower electrode 13 and the counter electrode 23 have a planar shape. For example, the lower electrodes 13 corresponding to the even-numbered gate-bus lines can be commonly connected, and the lower electrodes 13 corresponding to the odd-numbered gate-bus lines can be commonly connected. Such a group of commonly connected electrodes is also referred to as a planar electrode herein. The counter electrodes 23 are commonly connected for all the pixels.

The electrode width L of the comb-shaped electrode in the present embodiment is preferably 2 μm or greater, for example. The electrode gap S between the comb-shaped electrodes is preferably 2 μm or greater, for example. The upper limit thereof is preferably 7 μm, for example.

The ratio (L/S) between the electrode gap S and the electrode width L is preferably 0.4 to 3, for example. The lower limit thereof is more preferably 0.5, whereas the upper limit thereof is more preferably 1.5.

The cell gap d may be 2 μm to 7 μm. The cell gap is preferably 2 μm to 7 μm. The cell gap d (thickness of the liquid crystal layer) herein is preferably calculated by averaging the thicknesses throughout the liquid crystal layer in the liquid crystal display panel.

The liquid crystal display device of the present embodiment may appropriately include the components that usual liquid crystal display devices include (e.g. light source).

Subsequently, double source driving in Embodiments 2 and 3 mentioned later will be described.

Figure 3:
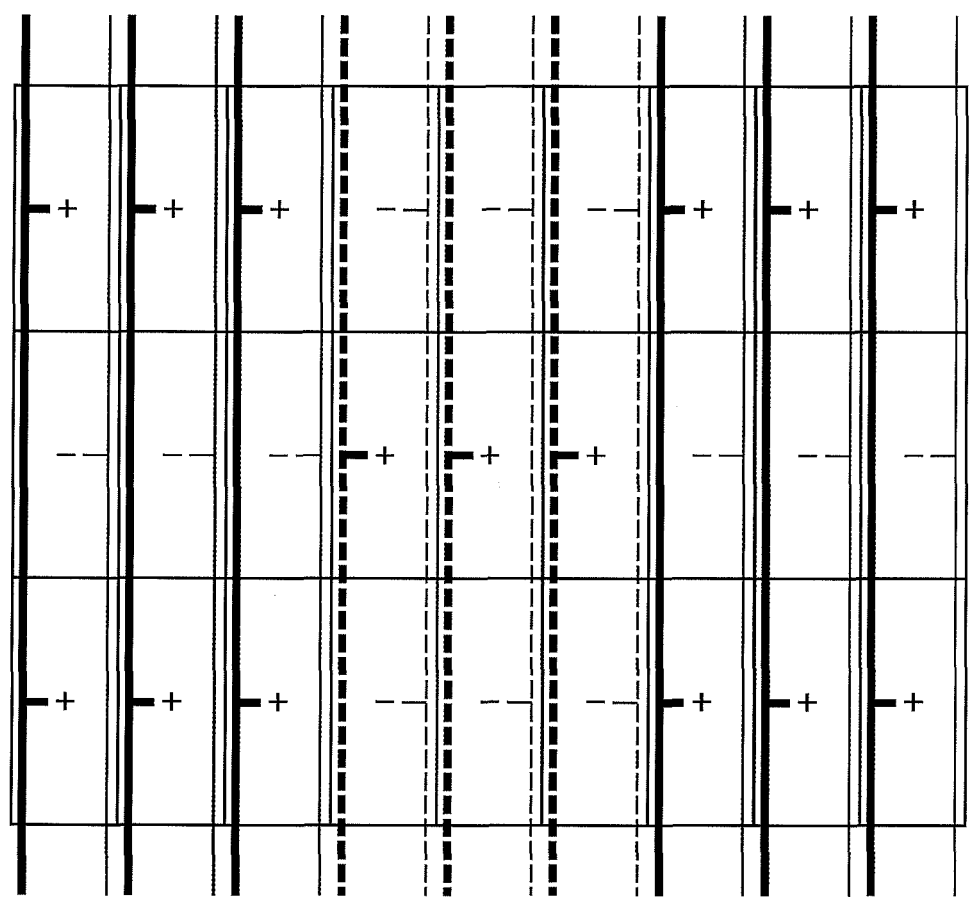
FIG. 3 is a schematic plan view showing a connection example of source bus lines of a thin film transistor array substrate capable of performing double source driving to pixel electrodes.

FIG. 3 is a schematic plan view showing a connection example of source bus lines of a thin film transistor array substrate capable of performing double source driving to pixel electrodes. In FIG. 3, both thick vertical lines and thin vertical lines represent source bus lines.

Writing can be performed in each two gate bus lines by simultaneously driving TFTs.

In a large panel, a writing time to pixels is extremely shortened during 240 Hz drive. For example, a writing time for one line in single source drive is 4 μs (=1 s/240 Hz/1080 lines) when the number of the gate bus lines is 1080. The pixels cannot be sufficiently charged due to the short writing time as mentioned above.

The double source driving allows a writing time of 8 μs (=1 s/240 Hz/540 lines), which is two times longer than the writing time of the single source drive, by simultaneously writing an nth pixel and an (n+1)th pixel (two gate bus lines are simultaneously written). This enables the writing time in the same manner as in a 120 Hz drive writing time of 8 μs (=1 s/120 Hz/1080 lines).

Embodiment 1 (The Case of Single Source Drive and Two TFTs)

Figure 4:
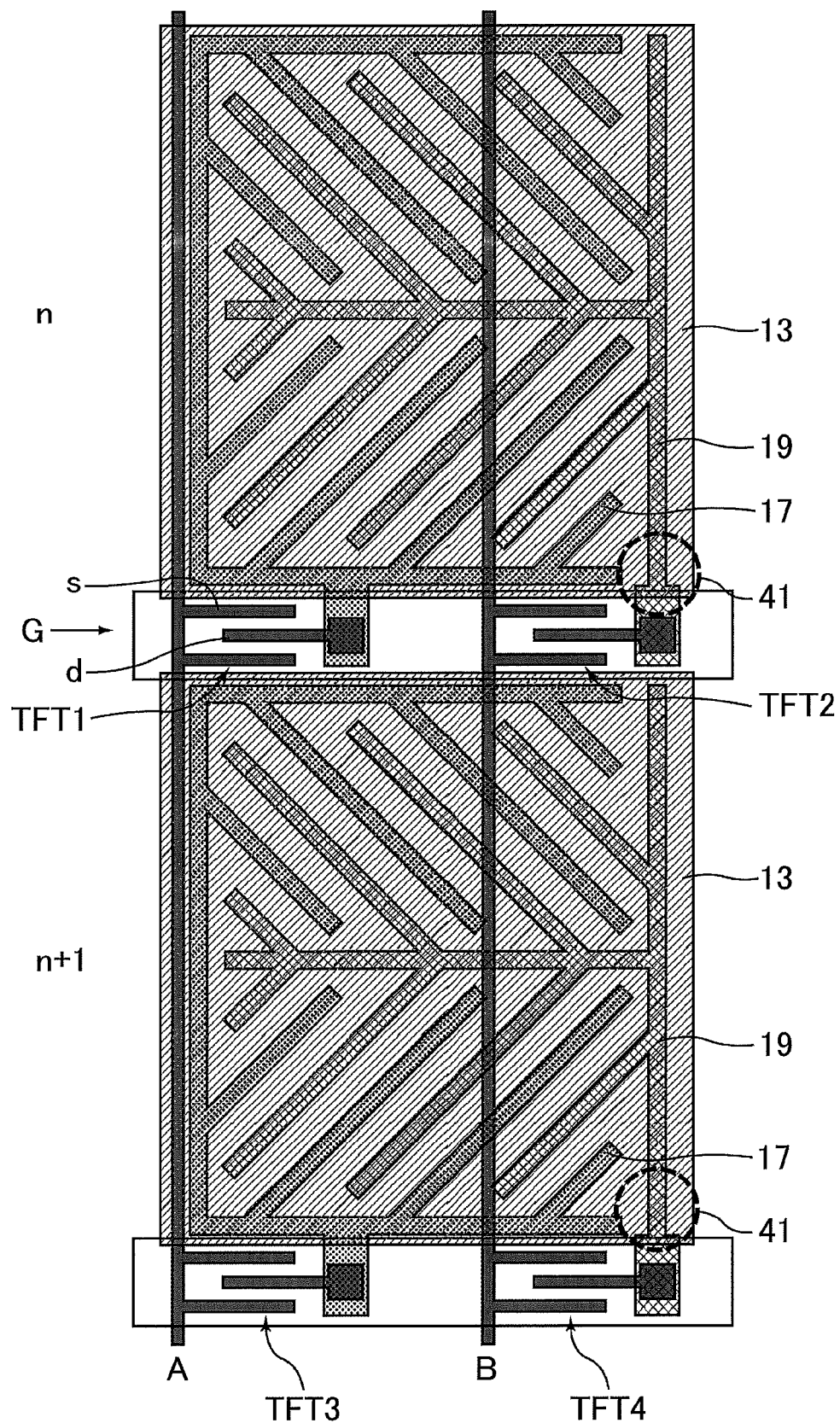
FIG. 4 is a schematic plan view showing a pixel of a thin film transistor array substrate according to Embodiment 1.

FIG. 4 is a schematic plan view showing a pixel of a thin film transistor array substrate according to Embodiment 1.

In Embodiment 1, the upper electrode (pixel electrode) 19, which corresponds to one of a pair of comb-shaped electrodes, preferably includes a projecting (T-shape) main body portion and the upper electrode 17 preferably includes a recessed main body portion. The main body portion of the upper electrode (pixel electrode) 19 and the main body portion of the upper electrode 17 are opposite to each other. Each of the upper electrode (pixel electrode) 19 and the upper electrode 17 includes a branched portions extending from the main body portion at an angle of 45° (135°). The branched portions may correspond to tooth portions of the comb-shaped electrode. The branched portions of the upper electrode (pixel electrode) 19 and the branched portions of the upper electrode 17 may be alternately disposed and may be opposite to each other. For such an electrode structure, the same shall apply to the following embodiments.

The upper electrode (pixel electrode) 19, which corresponds to one of the pair of comb-shaped electrodes, includes a linear portion along source bus lines A and B. The linear portion along the source bus lines A and B included in the upper electrode 19 is disposed at outmost portion in the pixel in a longitudinal direction of the gate bus line (rightmost side in the pixel of FIG. 4). The other main body portion along the gate bus line G extends in the left side in FIG. 4 at an angle of 90° to the linear portion from near the center of the linear portion along the source bus lines A and B.

The upper electrode 17, which corresponds to the other of the pair of comb-shaped electrode, includes linear portions along the gate bus line G. The linear portions along the gate bus line G are disposed at outmost portion in the pixel in a longitudinal direction of the source bus lines (uppermost side and lowermost side in the pixel of FIG. 4). The linear portion along the source bus lines A and B of the upper electrode 19 is disposed transversely to the linear portion along the gate bus line G of the upper electrode 17 in a portion 41 surrounded by dot lines in FIG. 4. The linear portion along the source bus lines A and B of the upper electrode 19 does not overlap the linear portions along the gate bus line G of the upper electrode 17. This allows the linear portion along the source bus lines A and B of the upper electrode 19 to be preferably connected to a drain electrode d of the thin film transistor element at a position overlapping the gate bus line G. The linear portion along the source bus lines A and B of the upper electrode 19 is longer than the linear portions along the gate bus line of the upper electrode 17. The linear portion along the source bus lines of the one of the upper electrode can be preferably connected to the drain electrode d when the linear portion along the source bus lines of the one of the upper electrodes is longer than the linear portions along the gate bus line of the other of the upper electrodes.

The main body portion of the upper electrode (pixel electrode) 19 is extended to the outside of the pixel (portion surrounded by dot lines). The contact between the drain electrode d and the upper electrode 19 is performed on the gate bus line G. This can sufficiently prevent alignment disorder generated when the contact between the drain electrode d and the upper electrode 19 is located near the pixel (portion overlapping a pixel region).

In FIG. 4, n assigns the nth pixel when a pixel line along the gate bus line in the pixel arrangement is counted from the upper side of the FIG. 4. Similarly, n+1 assigns the (n+1)th pixel. The same shall apply to the drawings to be mentioned later.

FIG. 4 of Embodiment 1 is a figure in which the lower electrode 13 is connected in a direction of the gate bus line or a direction of the source bus line as a common electrode when two TFTs exist in one pixel. Similarly, the present invention is also applicable to the case where three TFTs exist in one pixel so that the lower electrode 13 is driven by TFTs of each pixel.

Figure 5:
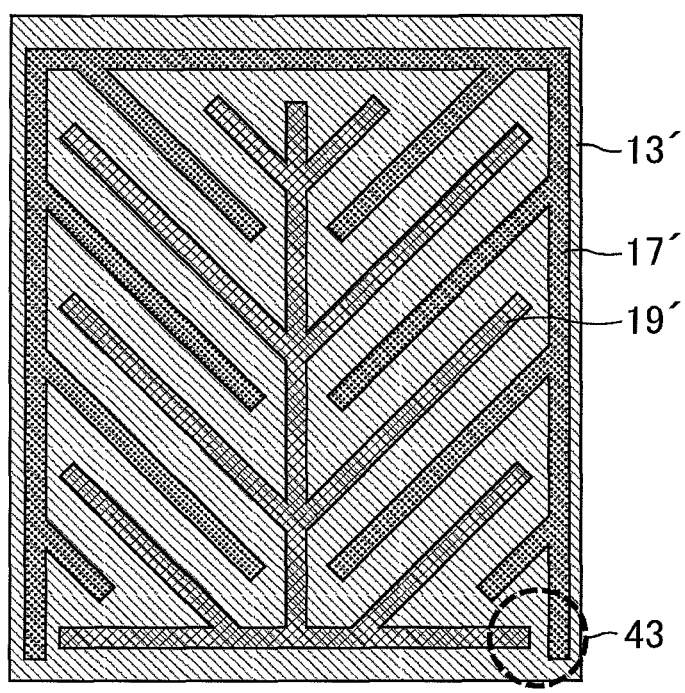
FIG. 5 is a schematic plan view showing a pixel of a thin film transistor array substrate according to a modified example of Embodiment 1.

FIG. 5 is a schematic plan view showing a pixel of a thin film transistor array substrate according to a modified example of Embodiment 1.

FIG. 5 shows the case where a pixel is rotated at 90° from the pixel in Embodiment 1. In this case, a linear portion along agate bus line of an upper electrode 19' is shorter and a linear portion along source bus lines of an upper electrode 17' is longer. The linear portion along the source bus lines (upper and lower directions in FIG. 5) of the upper electrode 17' is disposed transversely to the linear portion along the gate bus line (right and left directions in FIG. 5) of the upper electrode 19' in a portion 43 surrounded by dot lines in FIG. 5. Although not shown in FIG. 5, the linear portion along the source bus lines of the upper electrode 17' is connected to the drain electrode of the thin film transistor element at the position overlapping the gate bus line.

Embodiment 2 (The Case of Double Source Driving and Two TFTs: Inverting Pixel)

Figure 6:
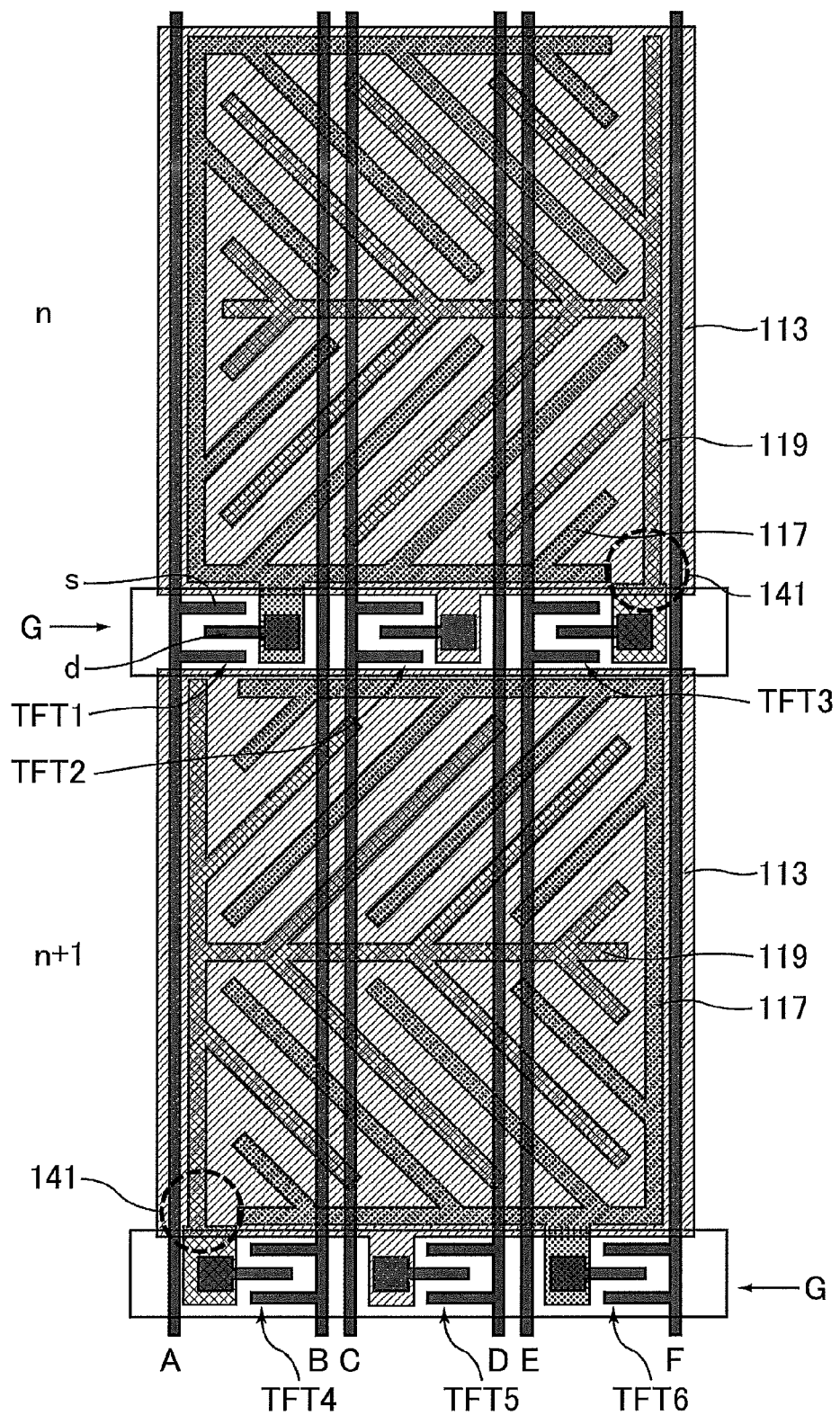
FIG. 6 is a schematic plan view showing a pixel of a thin film transistor array substrate according to Embodiment 2.

FIG. 6 is a schematic plan view showing a pixel of a thin film transistor array substrate according to Embodiment 2.

Linear portions, which are main body portions of an upper electrode 119, along source bus lines A to F are longer than linear portions along a gate bus line G of an upper electrode 117. This allows the linear portions along source bus lines A to F to be connected to a TFT 3 and a TFT 6 on the gate bus line G. In other words, the linear portions, which are main body portions of the upper electrode 117, along a gate bus line G are shortened in order to avoid interruption and the linear portions along the source bus lines of the upper electrode 119 are disposed transversely to the linear portions along the gate bus line G of the upper electrode 117 in portions 141 surrounded by dot lines.

The upper electrode 117 and the upper electrode 119 are disposed so as to invert an nth pixel to an (n+1)th pixel. This allows the linear portions along the source bus lines of the upper electrode to be electrically connected to the drain electrode of TFT on the gate bus line in both pixels.

In this case, the source bus lines are connected in the following order when A, B, C, D, E, and F are assigned to the source bus lines from the left edge.

A: Connected to the upper electrode 117 of the nth pixel

B: Connected to the upper electrode 119 of the (n+1)th pixel

C: Connected to a lower electrode 113 of the nth pixel

D: Connected to the lower electrode 113 of the (n+1)th pixel

E: Connected to the upper electrode 119 of the nth pixel and

F: Connected to the upper electrode 117 of the (n+1)th pixel

This type of connections is one of the preferable modes.

The source bus lines A and F connected to the upper electrode 117 and the source bus lines C and D connected to the lower electrode 113 may be vice versa. In addition, the source bus line C connected to the lower electrode 113 of the nth pixel and the source bus line D connected to the lower electrode 113 of the (n+1)th pixel may be vice versa, and the source bus line B connected to the upper electrode 119 of the (n+1)th pixel and the source bus line E connected to the upper electrode 119 of the nth pixel may be vice versa. It is important that the source bus lines B and E, which are disposed inward by one line from both outside portions of the pixel, are connected to the upper electrode 119, which is disposed transversely to the portion along the gate bus line of the upper electrode 117 and corresponds to one of the pair of comb-shaped electrodes. This mode is preferable.

Similarly, the pixel structure in Embodiment 2 can be applied when the lower electrodes 113 are connected each other in the direction of the gate bus line or the direction of the source bus line as a common electrode and one pixel is driven by two TFTs.

In the thin film transistor array substrate possible for the double source driving, the electrode of the nth pixel includes an inverted structure to the electrode of the (n+1)th pixel when the main body in the pixel center is not parallel to the source bus lines. This structure is preferred.

Figure 7:
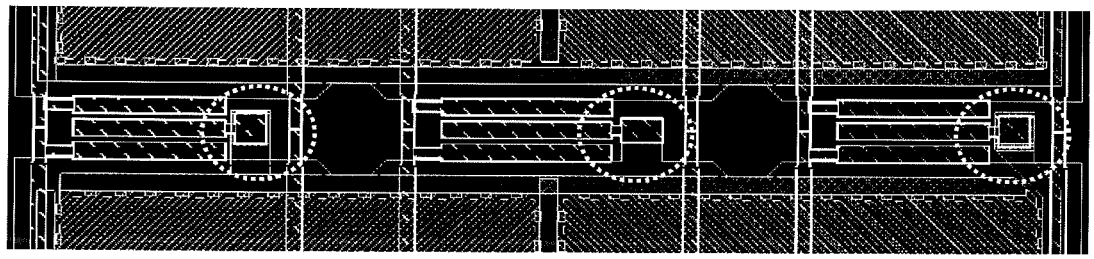
FIG. 7 is a view showing an arrangement of contact holes of a liquid crystal display device according to the present embodiment.

FIG. 7 is a view showing an arrangement of contact holes of a liquid crystal display device according to the present embodiment.

Contact holes are disposed in positions surrounded by white dot lines. The contact holes between the drain electrode and the upper electrode are disposed on the gate bus line. Thereby, as mentioned above, this can sufficiently prevent alignment disorder generated when the contact holes are located near the pixels.

Embodiment 3 (The Case of Double Source Driving and Three TFTs: rotating pixel at 90°)

Figure 8:
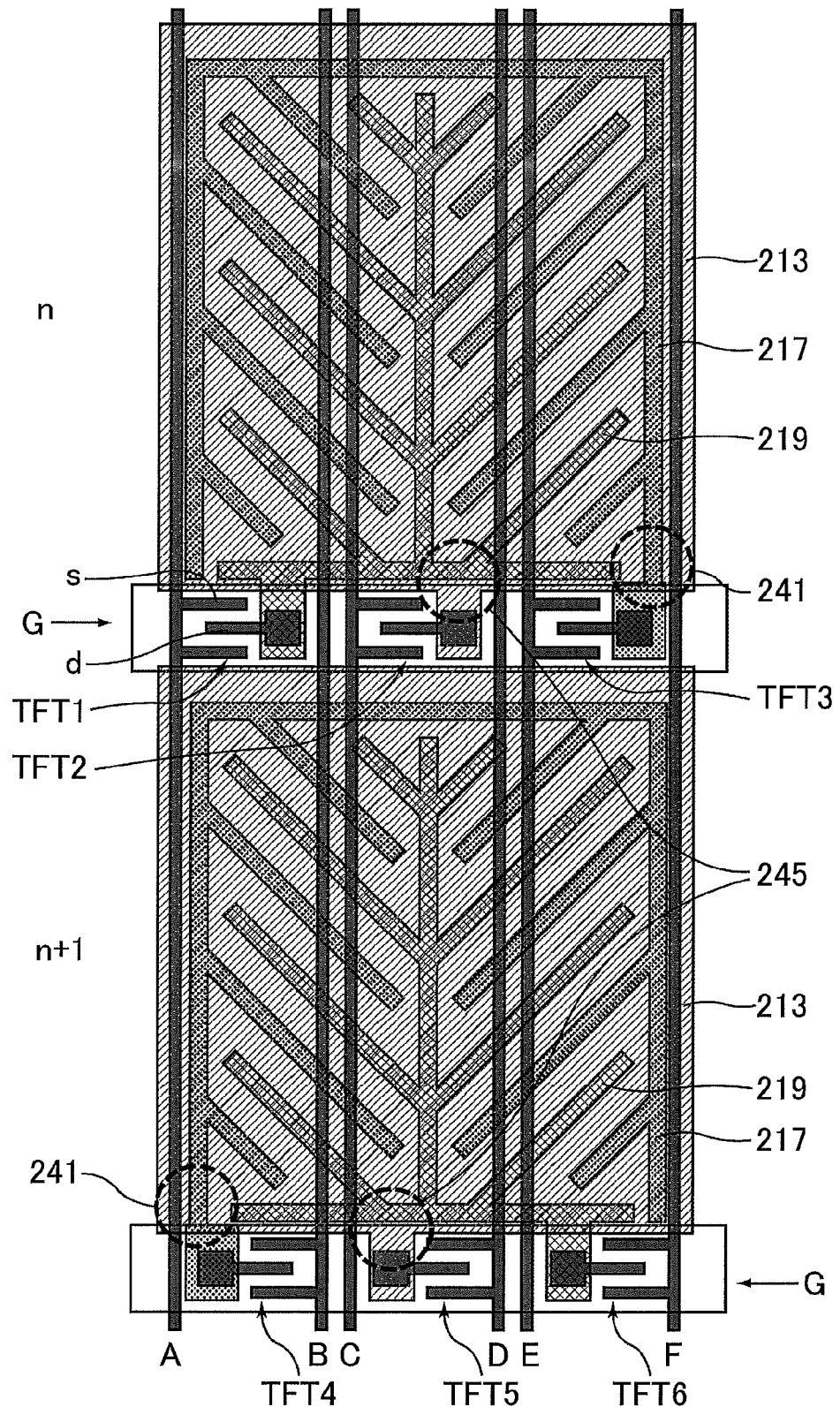
FIG. 8 is a schematic plan view showing a pixel of a thin film transistor array substrate according to Embodiment 3.

FIG. 8 is a schematic plan view showing a pixel of a thin film transistor array substrate according to Embodiment 3.

Linear portions, which are main body portions of an upper electrode 217, along source bus lines A to F, are longer than linear portions along a gate bus line G of an upper electrode 219. This allows the linear portions along source bus lines A to F to be connected to a TFT 3 and a TFT 4 on the gate bus line G. In other words, the linear portions along the gate bus line G, which are a main body portion of the upper electrode 219, are shortened in order to avoid interruption and the linear portions along the source bus lines of the upper electrode 217 are disposed transversely to the linear portions along the gate bus line G of the upper electrode 219 in portions 241 surrounded by dot lines.

The upper electrode 217 and the drain electrode d are connected without problems by rotating a pixel pattern of the upper electrode at 90° from the pixel pattern shown in Embodiment 1.

In this case, the source bus lines are connected in the following order when A, B, C, D, E, and F are assigned to the source bus lines from the left edge.

A: Connected to the upper electrode 219 of the nth pixel
B: Connected to the upper electrode 217 of the (n+1)th pixel
C: Connected to a lower electrode 213 of the nth pixel
D: Connected to the lower electrode 213 of the (n+1)th pixel
E: Connected to the upper electrode 217 of the nth pixel and
F: Connected to the upper electrode 219 of the (n+1)th pixel This type of connections is one of the preferable modes.

The source bus lines A and F connected to the upper electrode 219 and the source bus lines C and D connected to the lower electrode 213 may be vice versa. In addition, the source bus line A connected to the upper electrode 219 of the nth pixel and the source bus line F connected to the upper electrode 219 of the (n+1)th pixel may be vice versa, the source bus line C connected to the lower electrode 213 of the nth pixel and the source bus line D connected to the lower electrode 213 of the (n+1)th pixel may be vice versa, and the source bus line B connected to the upper electrode 217 of the (n+1)th pixel and the source bus line E connected to the upper electrode 217 of the nth pixel may be vice versa.

In Embodiment 3, as shown by a reference sign 245 in FIG. 8, the drain electrodes d are electrically connected to the lower electrodes 213. Alternatively, the lower electrodes 213 are connected each other in the direction of the gate bus line or the direction of the source bus line as a common electrode. This also allows one pixel to be driven by two TFTs. In this case, other pixel structures in Embodiment 3 can be preferably applicable in the same manner.

In Embodiment 3, it is important that both source bus lines (A and F) disposed at both outside portions of the pixel are electrically connected to the upper electrode (ii) (or lower electrode (iii)); the source bus lines (B and E) disposed inward by one line from both outside portions of the pixel are electrically connected to the upper electrode (i); and the source bus lines (C and D) disposed at the innermost portion are electrically connected to the lower electrode (iii) (or the upper electrode (ii)) as the connection order of six source bus lines. This is a particularly preferable mode. In other words, appropriate design can be achieved by designing the source bus line B and the source bus line E to be connected to the upper electrode (i).

Each embodiment mentioned above includes a long structure in which the main body of the upper electrode is extended to the gate bus line side in order to be connected to the drain electrode d.

In the embodiments of the present invention, an oxide semiconductor TFT (e.g. IGZO) is preferably used. The following will describe this oxide semiconductor TFT in detail.

The thin film transistor substrate includes a thin film transistor element. The thin film transistor element preferably includes an oxide semiconductor. In other words, an active layer of an active drive element (TFT) in the thin film transistor element is preferably formed using an oxide semiconductor film such as zinc oxide instead of a silicon semiconductor film. Such a TFT is referred to as an "oxide semiconductor TFT". The oxide semiconductor characteristically shows higher carrier mobility and less unevenness in its properties than amorphous silicon. Thus, the oxide semiconductor TFT is driven faster than an amorphous silicon TFT, has a higher driving frequency, and is suitably used for driving of higher-definition next-generation display devices. In addition, the oxide semiconductor film is formed by an easier process than a polycrystalline silicon film. Thus, it is advantageously applied to devices requiring a large area.

The following characteristics markedly appear in the case of applying the liquid crystal driving method of the present embodiments especially to FSDs (field sequential display devices).

Figure 9:
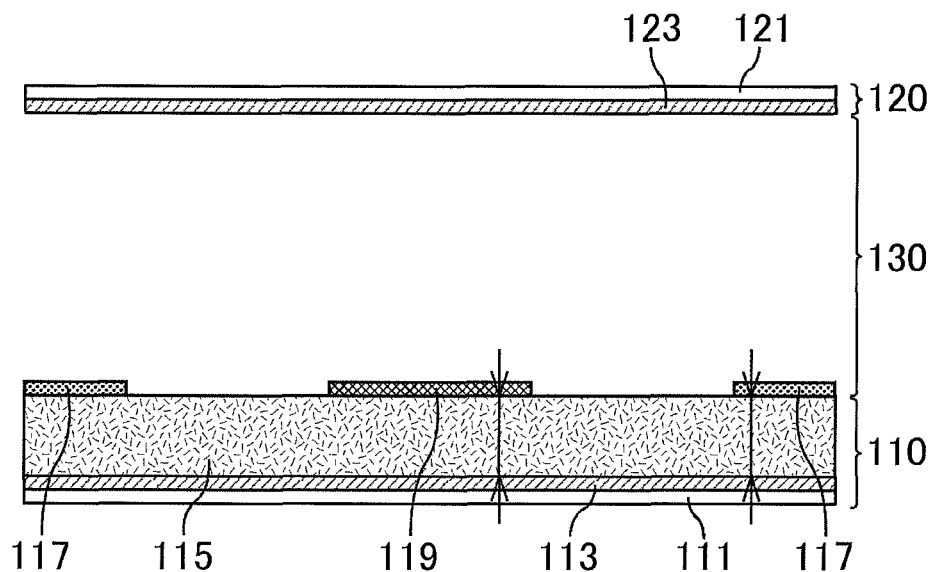
FIG. 9 is a schematic cross-sectional view showing one example of a liquid crystal display device of the present embodiment.

(1) The pixel capacitance is higher than that in a usual VA (vertical alignment) mode (FIG. 9 is a schematic cross-sectional view showing one example of a liquid crystal display device of the present embodiment; in FIG. 9, a large capacitance is generated between the upper electrode and the lower electrode at the portion indicated by an arrow and the pixel capacitance is higher than in the liquid crystal display device of a usual vertical alignment (VA) mode). (2) One pixel of a FSD type is equivalent to three pixels (RGB), and thus the capacitance of one pixel is trebled. (3) The gate ON time is very short because 240 Hz or higher driving is required.

Advantages of applying the oxide semiconductor TFT (e.g. IGZO) are as follows.

Based on the characteristics (1) and (2), a 52-inch device has a pixel capacitance of about 20 times as high as a 52-inch UV2A 240-Hz drive device.

Thus, a transistor produced using conventional a-Si is as great as about 20 times or more, disadvantageously resulting in an insufficient aperture ratio.

The mobility of IGZO is about 10 times that of a-Si, and thus the size of the transistor is about $\frac{1}{10}$.

Although the liquid crystal display device using color filters (RGB) includes three transistors, the FSD type device includes only one transistor. Thus, the device can be produced in a size as small as or smaller than that with a-Si.

As the size of the transistor becomes smaller, the Cgd capacitance also becomes smaller. This reduces the load on the source bus lines.

(Specific Example)

Figure 10:
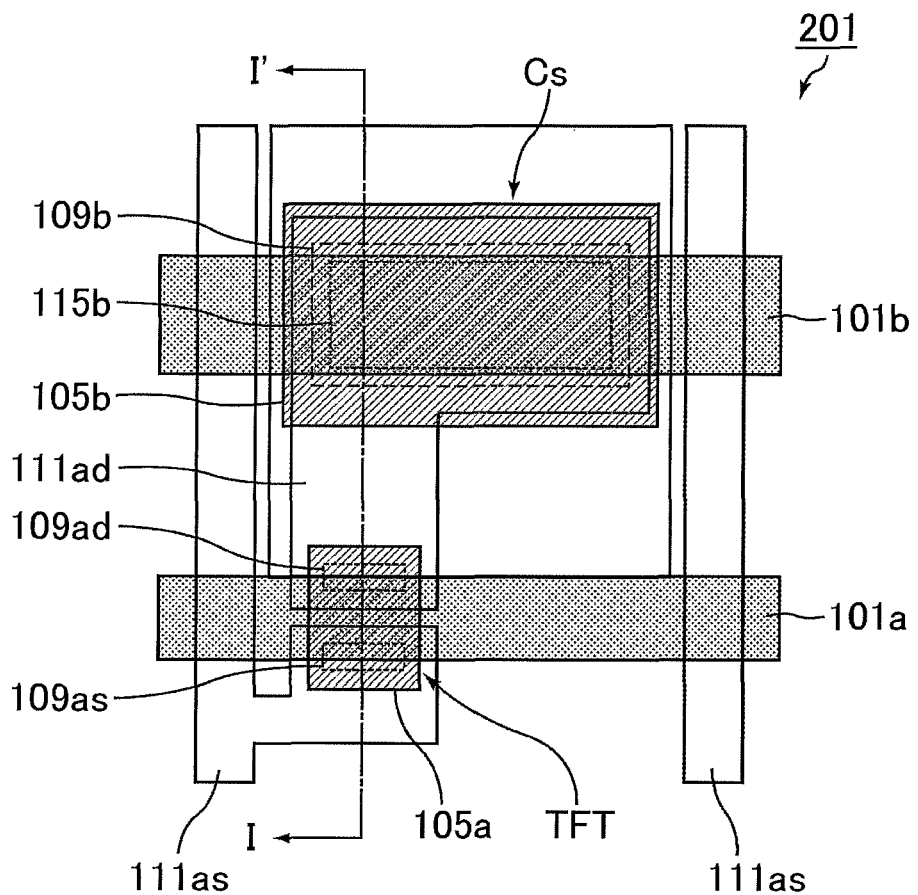
FIG. 10 is a schematic plan view showing an active drive element and its vicinity used in the present embodiment.
Figure 11:
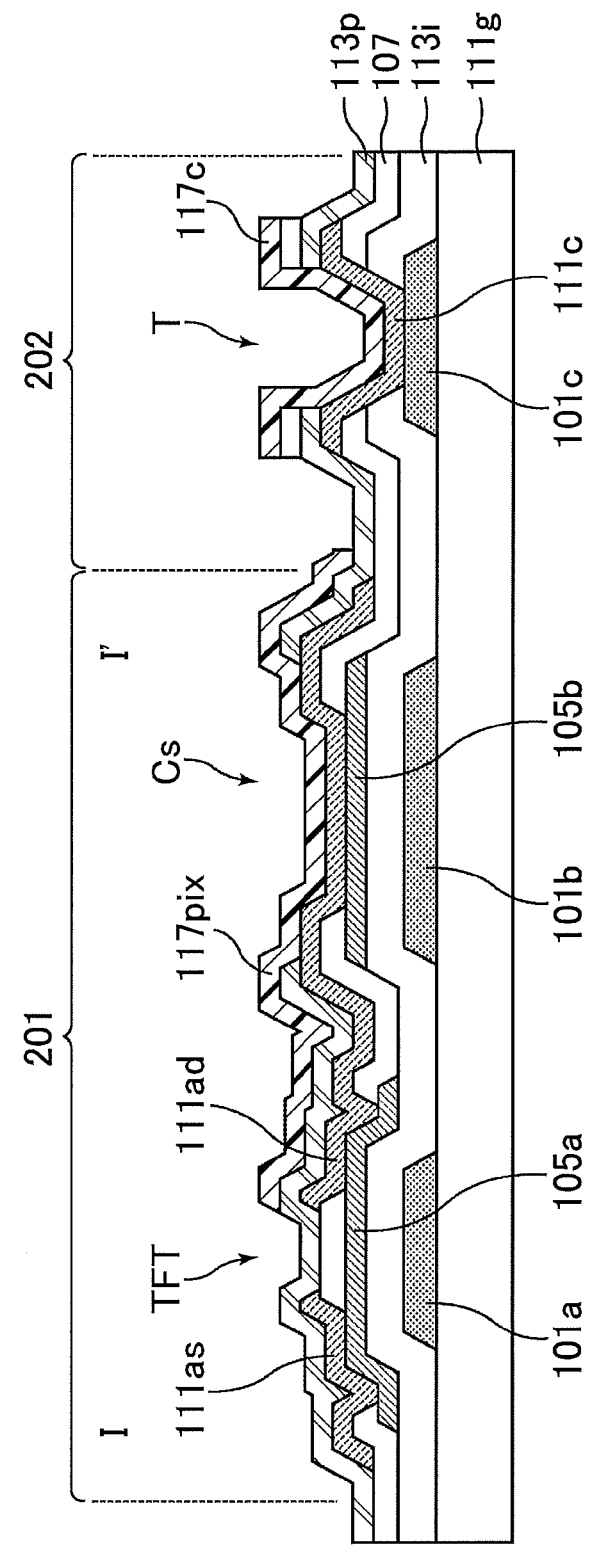
FIG. 11 is a schematic cross-sectional view showing an active drive element and its vicinity used in the present embodiment.

FIG. 10 and FIG. 11 each show a structure (example) of the oxide semiconductor TFT. FIG. 10 is a schematic plan view showing an active drive element and its vicinity used in the present embodiment. FIG. 11 is a schematic cross-sectional view showing an active drive element and its vicinity used in the present embodiment. The symbol T indicates a gate and source terminal. The symbol Cs indicates an auxiliary capacitance.

The following will describe one example (the corresponding portion) of a production process of the oxide semiconductor TFT.

Active layer oxide semiconductor layers 105a and 105b of an active drive element (TFT) using the oxide semiconductor film are formed as follows.

At first, for example, an In—Ga—Zn—O semiconductor (IGZO) film with a thickness of 30 nm or greater but 300 nm or smaller is formed on an insulating film 113i by a sputtering method. Then, a resist mask is formed by photolithography so as to cover predetermined regions of the IGZO film. Next, portions of the IGZO film other than the regions covered by the resist mask are removed by wet etching. Thereafter, the resist mask is peeled off. This provides island-shaped oxide semiconductor layers 105a and 105b. The oxide semiconductor layers 105a and 105b may be formed using other oxide semiconductor films instead of the IGZO film.

Next, an insulating film 107 is deposited on the whole surface of a substrate 111g and then the insulating film 107 is patterned.

Specifically, at first, an SiO$_2$ film (thickness: about 150 nm, for example) as the insulating film 107 is formed on the insulating film 113i and the oxide semiconductor layers 105a and 105b by a CVD method.

The insulating film 107 preferably includes an oxide film such as SiOy.

Use of the oxide film can recover oxygen deficiency on the oxide semiconductor layers 105a and 105b by the oxygen in the oxide film, and thus it more effectively suppresses oxygen deficiency on the oxide semiconductor layers 105a and 105b. Here, a single layer consists of an SiO$_2$ film is used as the insulating film 107. Still, the insulating film 107 may include a stacked structure of an SiO$_2$ film as a lower layer and an SiNx film as an upper layer.

The thickness (in the case of a stacked structure, the sum of the thicknesses of the layers) of the insulating film 107 is preferably 50 nm or greater but 200 nm or smaller. The insulating film with a thickness of 50 nm or greater more securely protects the surfaces of the oxide semiconductor layers 105a and 105b in the step of patterning the source and drain electrodes. If the thickness of the insulating film exceeds 200 nm, the source electrodes and the drain electrodes may have a higher step, so that disconnection may occur.

The oxide semiconductor layers 105a and 105b in the present embodiment are preferably formed from, for example, a Zn—O semiconductor (ZnO), an In—Ga—Zn—O semiconductor (IGZO), an In—Zn—O semiconductor (IZO), or a Zn—Ti—O semiconductor (ZTO). Particularly preferred is an In—Ga—Zn—O semiconductor (IGZO).

The present mode provides certain effects in combination with the above oxide semiconductor TFT. Still, the present mode can also be driven using a known TFT element such as an amorphous Si TFT or a polycrystalline Si TFT.

COMPARATIVE EXAMPLE 1

The case of single source drive and two TFTs

Figure 12:
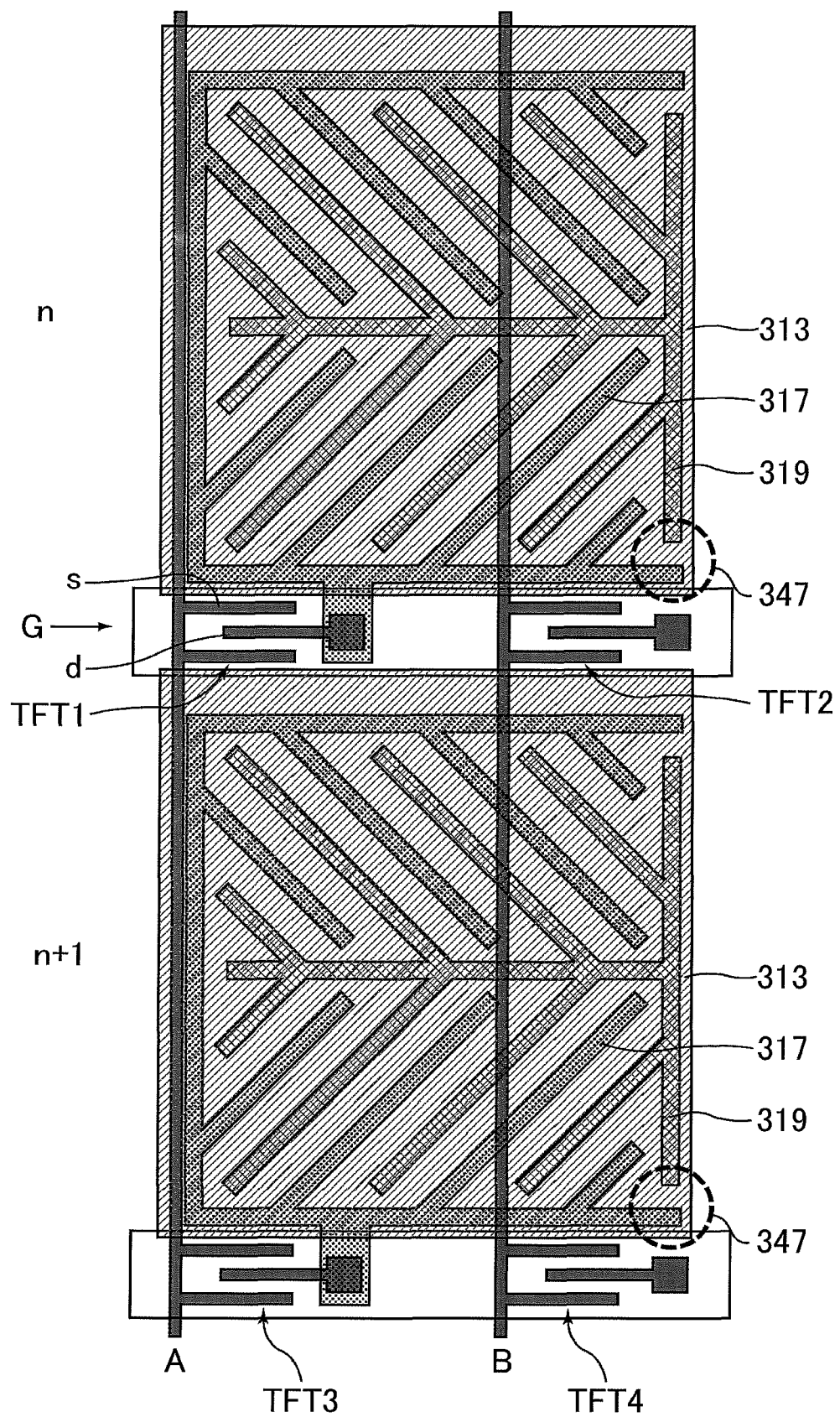
FIG. 12 is a schematic plan view showing a pixel of a thin film transistor array substrate according to Comparative Example 1.

FIG. 12 is a schematic plan view showing a pixel of a thin film transistor array substrate according to Comparative Example 1.

In a liquid crystal display device of electric field ON/electric field ON mode, one pixel needs two TFTs when an upper electrode 317 and an upper electrode 319 are driven by TFTs.

Left source bus line A is connected to the upper electrode 317. Right source bus line B is a source bus line being connected to the upper electrode 319. However, the source bus line B cannot be connected to the upper electrode 319 as shown in portions 347 surrounded by dot lines because the main body of the upper electrode 317 is too long. The same shall apply to the thin film transistor array substrate in which a lower electrode 313 is driven by TFTs and one pixel uses three TFTs.

COMPARATIVE EXAMPLE 2

The case of double source driving and two TFTs)

Figure 13:
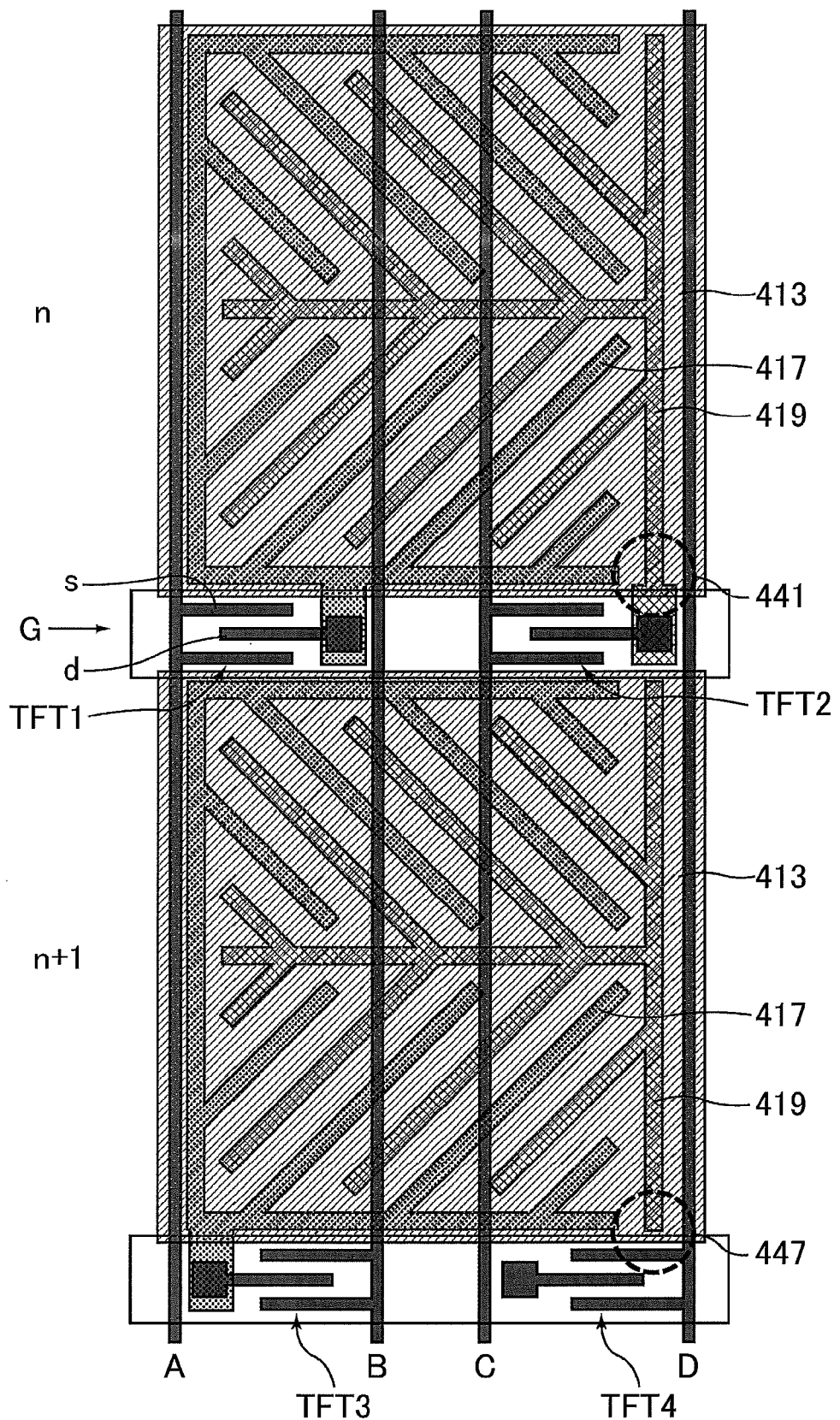
FIG. 13 is a schematic plan view showing a pixel of a thin film transistor array substrate according to Comparative Example 2.

FIG. 13 is a schematic plan view showing a pixel of a thin film transistor array substrate according to Comparative Example 2.

In a liquid crystal display device of electric field ON/electric field ON mode, one pixel needs two TFTs when an upper electrode 417 and an upper electrode 419 are driven.

Each two pixels should be simultaneously written by the double source driving because an ON time of TFTs is too short when 240 Hz drive is performed. "+" and "−" are alternately written to the source bus lines for polarity inversion.

Two left source bus lines A and B are connected to the upper electrode 417.

Two right source bus lines C and D are source bus lines being connected to the upper electrode 419. However, the source bus lines C and D cannot be connected to the upper electrode 419 because the apex of the drain d is not directed to a direction of the upper electrode 419 in the (n+1)th pixel.

In the case of the single source drive, the two right source bus lines C and D cannot be connected to the upper electrode 419 when the main body of the upper electrode 417 is too long.

COMPARATIVE EXAMPLE 3

The case of double source driving and three TFTs)

Figure 14:
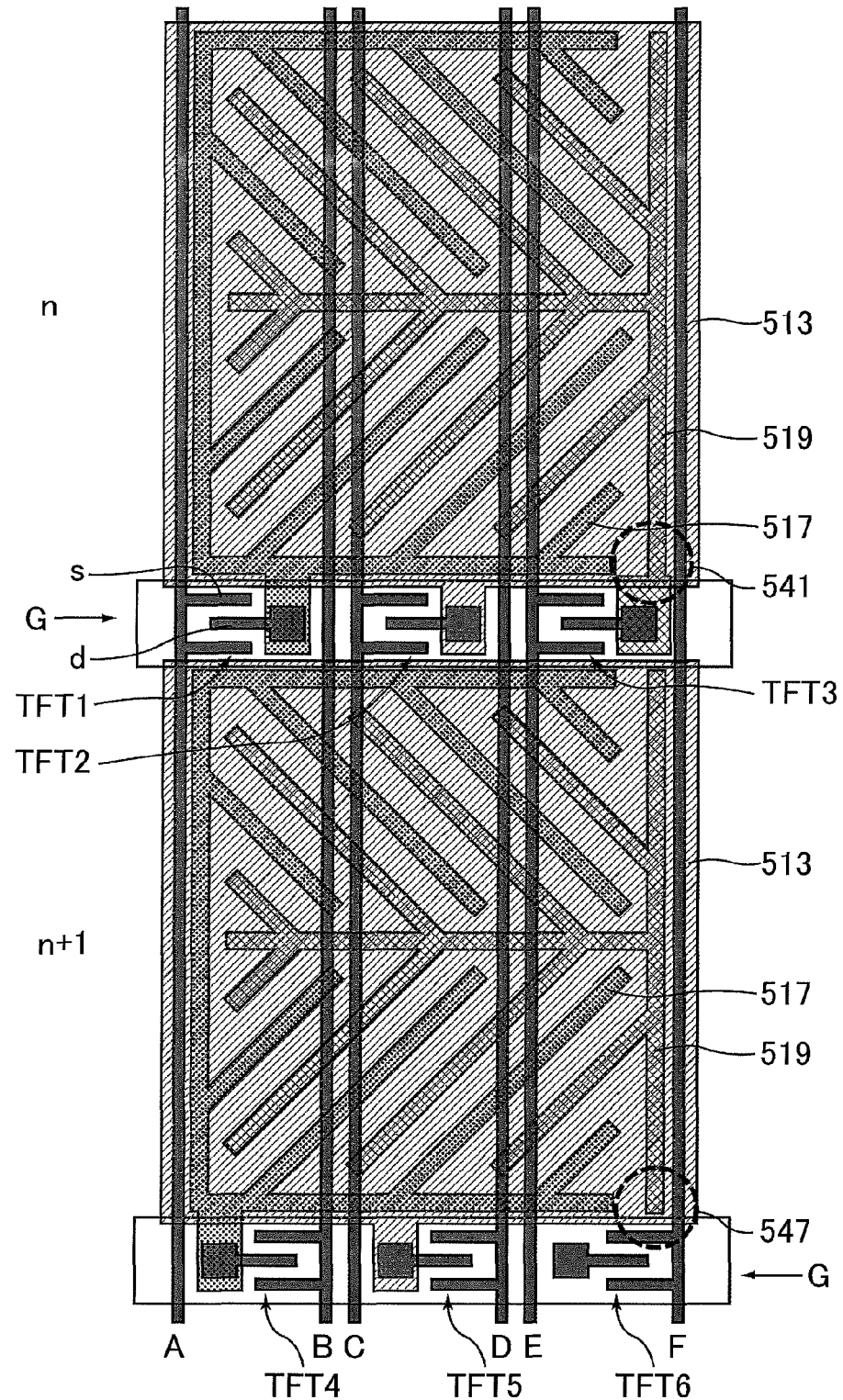
FIG. 14 is a schematic plan view showing a pixel of a thin film transistor array substrate according to Comparative Example 3.

FIG. 14 is a schematic plan view showing a pixel of a thin film transistor array substrate according to Comparative Example 3.

In a liquid crystal display device of electric field ON/electric field ON mode, one pixel uses three TFTs when voltages are separately applied to an upper electrode 517, an upper electrode 519, and a lower electrode 513.

Each two pixels should be simultaneously written by the double source driving because an ON time of TFTs is too short when 240 Hz drive is performed.

One pixel includes a total of six source bus lines because one pixel includes three TFTs. "+" and "−" are alternately written to the source bus lines for polarity inversion.

Two left source bus lines A and B are connected to the upper electrode 517.

Two innermost source bus lines C and D are connected to the lower electrode 513.

Two right source bus lines E and F are source bus lines being connected to the upper electrode 519. However, in the (n+1)th pixel, the source bus lines E and F cannot be connected because the apex of the drain d is not directed to a direction of the upper electrode 519 in the (n+1)th pixel.

The same shall apply to the thin film transistor array substrate in which the lower electrode 513 is not driven by TFTs and one pixel includes two TFTs.

In the case of the single source drive, the two right source bus lines E and F cannot be connected to the upper electrode 519 when the main body of the upper electrode 517 is too long.

Modified example of Comparative Example 3

Figure 15:
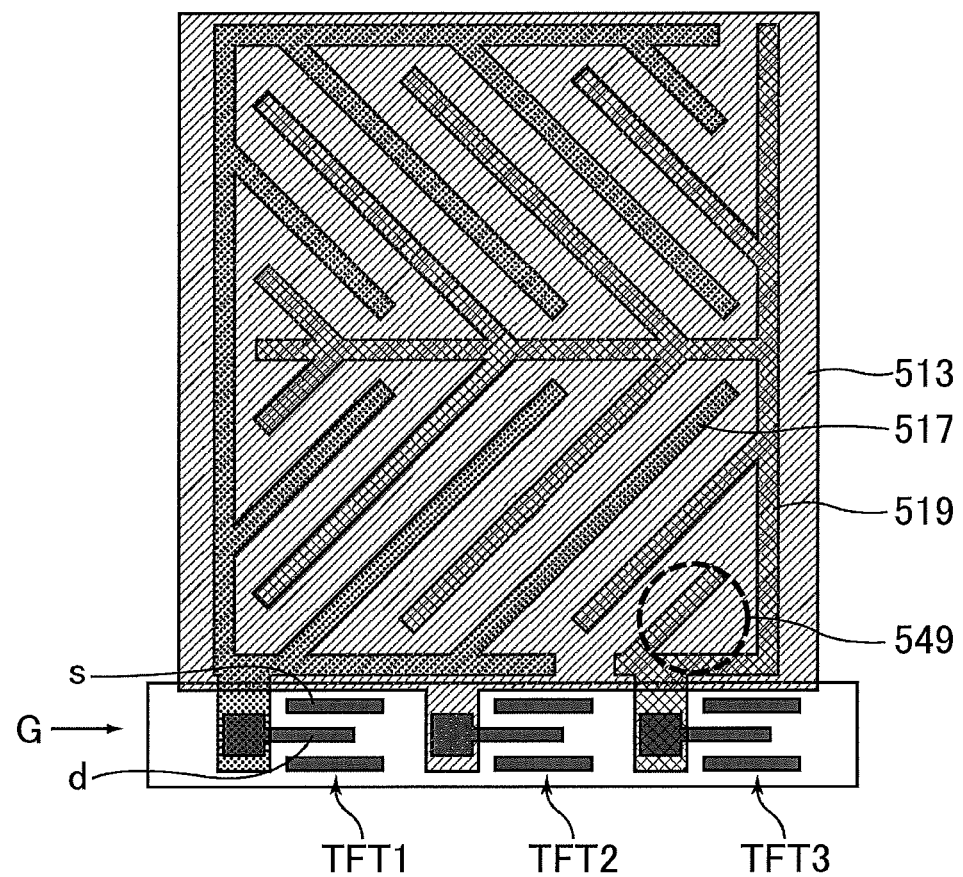
FIG. 15 is a schematic plan view showing a pixel of a thin film transistor array substrate according to a modified example of Comparative Example 3.

FIG. 15 is a schematic plan view showing a pixel of a thin film transistor array substrate according to a modified example of Comparative Example 3.

In Comparative Example 3, connection of the drain d and the upper electrode 519 by extending the upper electrode 519 to the drain d side reduces the aperture ratio by the area of the extended portion. FIG. 15 shows a modified example of Comparative Example 3 in which the drain d and the upper electrode 519 are connected by extending the upper electrode 519 in Comparative Example 3 to the drain d side. In the modified example, alignment of the liquid crystal is disordered and the transmittance is reduced because a region 549 surrounded by dot lines does not adequately control the alignment of the liquid crystal while a pair of comb-shaped electrodes can control the alignment of the liquid crystal.

Each of the embodiments makes the production of a thin film transistor array substrate easy and is capable of providing a high transmittance. Further, the embodiments are capable of implementing a field sequential mode, and provide a response speed suitable for onboard display devices and liquid crystal display devices (3D liquid crystal display devices) capable of displaying a stereoscopic image. Particularly, it is preferred that the liquid crystal drive device implements field sequential driving and includes a circularly polarizing plate. The liquid crystal drive device includes no color filter, and thus field sequential driving causes greater internal reflection. This is because a color filter usually reduces the transmittance to ⅓ of that without a color filter and the reflected light passes the color filter twice, so that the color filter reduces the internal reflection to about 1/10. Subsequently, a circularly polarizing plate sufficiently reduces such internal reflection. Electrode structures according to the liquid crystal display panel, the liquid crystal display device, and the thin film transistor array substrate of the present invention can be confirmed by microscopic observation such as SEM (Scanning Electron Microscope) in the TFT substrate and the counter substrate.

The term "small-size liquid crystal display panel" herein means 10 or smaller inch displays for mobile devices. The term "large-size panel" herein means displays for televisions larger than 20-inch displays for personal computers.

The above embodiments describe the cases where electrodes are electrically connected in each odd-numbered pixel line and in each even-numbered pixel line, and such a mode is preferred for inversion driving. The number of TFTs per pixel can be reduced when the electrodes are at least electrically connected along the pixel line. For example, the electrodes may be connected in every multiple pixel lines (in every n lines (n is an integer of 2 or greater)) other than the pixel lines described above.

Electrode structures according to the liquid crystal driving method and the liquid crystal display device of the present invention can be confirmed by microscopic observation such as SEM (Scanning Electron Microscope) in the TFT substrate and the counter substrate. The liquid crystal driving method of the present invention can be confirmed by verifying a driving voltage using a common method in the technical field of the present invention.

The liquid crystal display device including the aforementioned thin film transistor array substrate may appropriately include the components that usual liquid crystal display devices include (e.g. light source).

The aforementioned modes of the embodiments may be employed in appropriate combination as long as the combination is not beyond the spirit of the present invention.

The present application claims priority to Patent Application No. 2011-239348 filed in Japan on Oct. 31, 2011 under the Paris Convention and provisions of national law in a designated State, the entire contents of which are hereby incorporated by reference.

REFERENCE SIGNS LIST 10, 110: thin film transistor array substrate
11, 21: glass substrate
13, 13', 23, 113, 213, 313, 413, 513: lower electrode
15, 415, 515: insulating layer
16: pair of comb-shaped electrodes
17, 17', 19, 19', 117, 119, 217, 219, 317, 319, 417, 419, 517, 519: upper electrode
20: counter substrate
23: counter electrode
30: liquid crystal layer
31: liquid crystal (liquid crystal molecules)
101a: gate wiring
101b: auxiliary capacitance wiring
101c: connection portion
111g: substrate
113i: insulating film (gate insulator)
105a, 105b: oxide semiconductor layer (active layer)
107: insulating film (etching stopper, protection film)
109 as, 109ad, 109b, 115b: opening
111 as: source wiring
111ad: drain wiring
111c, 117c: connection portion
113p: protection film
117pix: pixel electrode
201: pixel portion
202: terminal-located region
T: gate and source terminal

The invention claimed is:

1. A thin film transistor array substrate, comprising:
a thin film transistor element;
gate bus lines; and
source bus lines,
wherein the thin film transistor array substrate includes a first electrode and a second electrode,
the first electrode includes a linear portion along the source bus lines,
the first electrode includes a linear portion along the gate bus lines,
at least one linear portion along the source bus lines is disposed transversely to the linear portion along the gate bus lines in a plan view of a main face of the substrate and is connected to a drain electrode of the thin film transistor element at a position overlapping the gate bus lines,
the source bus lines include at least two source bus lines that simultaneously drive at least two pixels along the source bus lines, and
the second electrode is a planar electrode.

2. The thin film transistor array substrate according to claim 1,
wherein the linear portion along the source bus lines is longer than the linear portion along the gate bus lines in a plan view of the main face of the substrate.

3. The thin film transistor array substrate according to claim 1,
wherein the first electrode is disposed in each pixel,
the linear portion along the gate bus lines passes through the center of the pixel, and
the first electrodes that are disposed in two pixels adjacent each other along the source bus lines include a structure which is mutually inverted in a plan view of the main face of the substrate.

4. The thin film transistor array substrate according to claim 1,
wherein the first electrode is a pair of comb-shaped electrodes,
one of the pair of comb-shaped electrodes includes a linear portion along the source bus lines, and
the other of the pair of comb-shaped electrodes includes a linear portion along the gate bus lines.

5. The thin film transistor array substrate according to claim 4,
wherein the thin film transistor array substrate includes at least four source bus lines overlapped with one pixel, and each of two source bus lines disposed inward by one line from outside portions of the pixel is electrically connected to the one of the pair of comb-shaped electrodes or electrically connected to the other of the pair of comb-shaped electrodes.

6. The thin film transistor array substrate according to claim 4,
wherein the thin film transistor array substrate includes at least four source bus lines overlapped with one pixel, and
two source bus lines disposed inward by one line from outside portions of the pixel are connected to outside linear portions of the pair of comb-shaped electrodes.

7. The thin film transistor array substrate according to claim 1,
wherein the planar electrode is commonly connected between pixels in a direction of the source bus lines or pixels in a direction of the gate bus lines.

8. The thin film transistor array substrate according to claim 1,
wherein the thin film transistor element includes an oxide semiconductor.

9. The thin film transistor array substrate according to claim 1,
wherein the first electrode is an electrode for generating a transverse electric field.

10. A liquid crystal display device, comprising the thin film transistor array substrate according to claim 1.

* * * * *